(12) United States Patent
Gaede

(10) Patent No.: US 8,044,735 B2
(45) Date of Patent: Oct. 25, 2011

(54) OSCILLATOR CIRCUIT AND METHOD FOR INFLUENCING, CONTROLLING, OR REGULATING THE FREQUENCY OF AN OSCILLATOR

(75) Inventor: Dirk Gaede, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 372 days.

(21) Appl. No.: 11/991,486

(22) PCT Filed: Sep. 2, 2006

(86) PCT No.: PCT/EP2006/008588
§ 371 (c)(1),
(2), (4) Date: May 9, 2008

(87) PCT Pub. No.: WO2007/025777
PCT Pub. Date: Mar. 8, 2007

(65) Prior Publication Data
US 2009/0115538 A1    May 7, 2009

(30) Foreign Application Priority Data
Sep. 2, 2005  (DE) .................. 10 2005 041 759

(51) Int. Cl.
*H03K 3/02*  (2006.01)
(52) U.S. Cl. ............. 331/143; 331/177 R; 331/111
(58) Field of Classification Search .......... 331/111, 331/143, 153, 177 R, 172, 173, 34, 177 V, 331/36 C
See application file for complete search history.

(56) References Cited

U.S. PATENT DOCUMENTS

| | | | |
|---|---|---|---|
| 3,688,220 A | | 8/1972 | Gay |
| 4,631,501 A | | 12/1986 | Matthys |
| 5,084,685 A | * | 1/1992 | Moller et al. .............. 331/1 A |
| 5,644,270 A | | 7/1997 | Moyer et al. |
| 5,702,426 A | * | 12/1997 | Pons et al. .................. 607/27 |
| 7,375,597 B2 | * | 5/2008 | Greenberg et al. .......... 331/74 |

FOREIGN PATENT DOCUMENTS

| | | |
|---|---|---|
| DE | 4033025 | 4/1992 |
| EP | 0310783 | 4/1989 |
| EP | 0413473 | 2/1991 |
| WO | 8502076 | 5/1985 |
| WO | WO88/02704 | 4/1988 |

OTHER PUBLICATIONS

Tsividis et al, "Continuous-Time MOSFET-C Filters in VLSI", Feb. 1986, IEEE Journal of Solid-State Circuits, vol. SC-21, No. 1, pp. 15-30.*

* cited by examiner

*Primary Examiner* — Ryan Johnson
(74) *Attorney, Agent, or Firm* — Horst M. Kasper

(57) ABSTRACT

An oscillator circuit according to the invention comprises an oscillator with a toggle circuit having an output and an inverting input, whereby the output is connected to the inverting input via a feedback resistor, the inverting input is connected, for example, to the ground, via a first oscillator capacitor, and also connected, for example, to the ground, via a second oscillator capacitor and via a control resistor whose value can be adjusted or electrically controlled, so that the frequency of the oscillator can be varied by increasing or decreasing the value of the control resistor. In order to control the value of the control resistor, preferably a modulated 1-bit signal is used that is integrated by an integrator. Preferably, the oscillator is an integral part of a closed-loop control circuit in which the frequency of the oscillator forms the actual value and a predefined target frequency forms the target value.

35 Claims, 8 Drawing Sheets

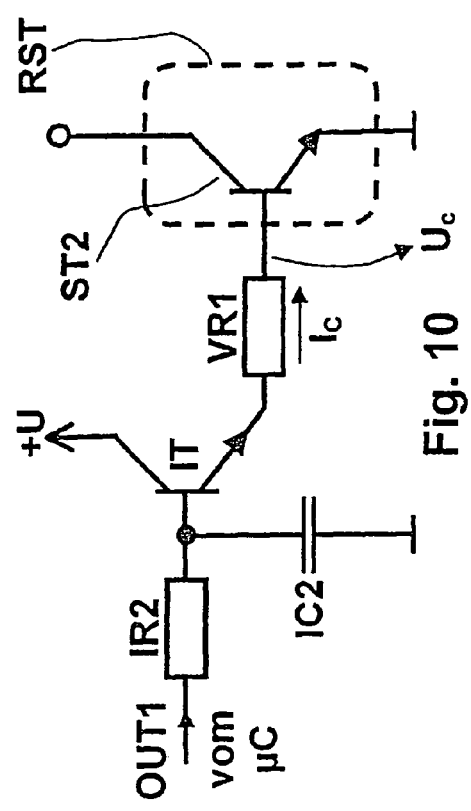
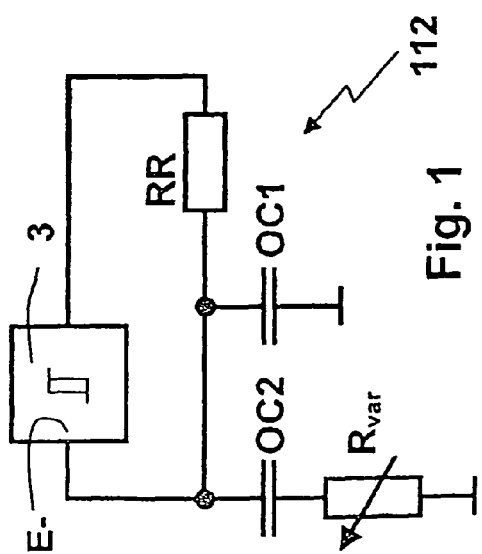
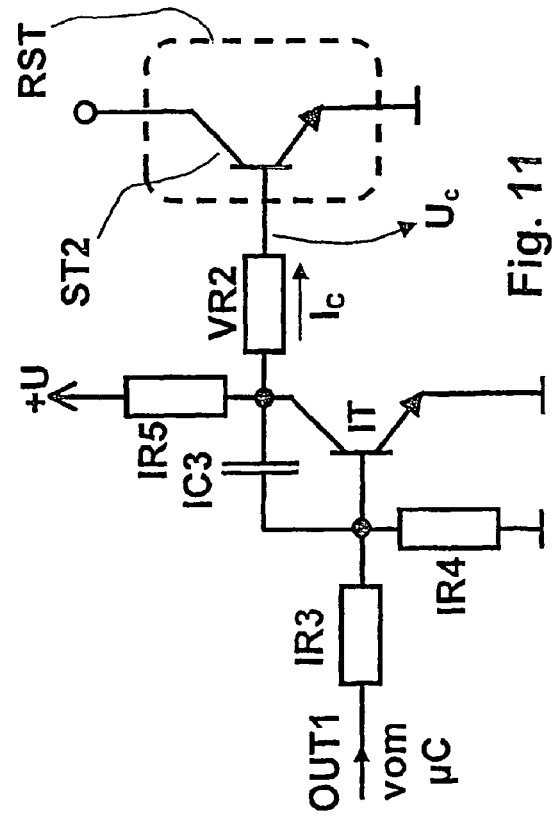
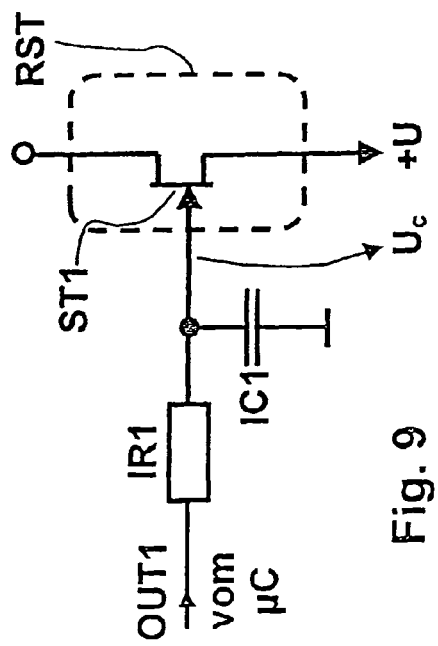
Fig. 10
Fig. 11
Fig. 1
Fig. 9

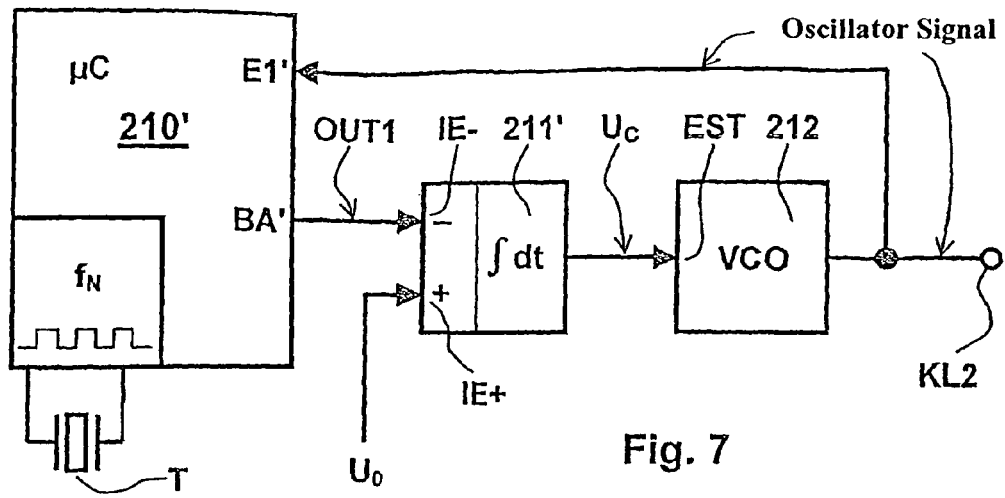
Fig. 7
| OUT A | OUT B | OUT C | Mode |
|---|---|---|---|
| H | H | H | Rapid Integration Control Signal OUT1 = H |
| L | L | L | Rapid Integration Control Signal OUT1 = L |
| x | L | H | Slow Integration |
| x | H | L | Forbidden State |
Fig. 21
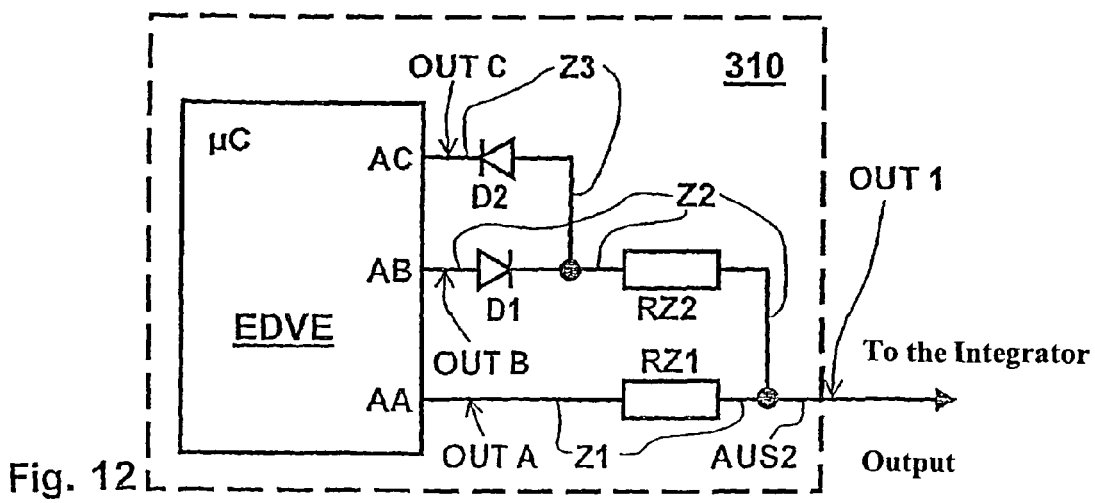
Fig. 12

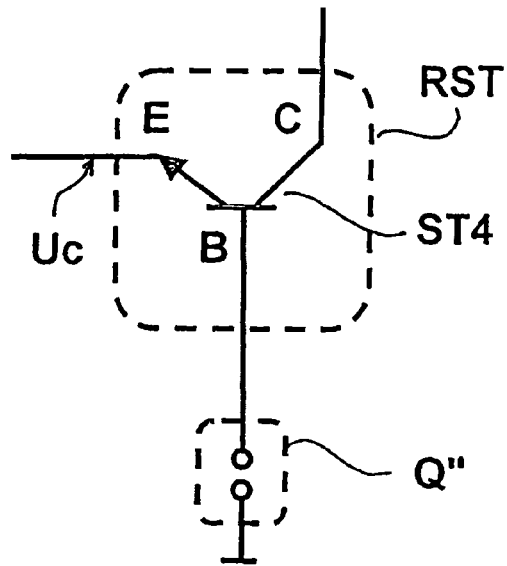
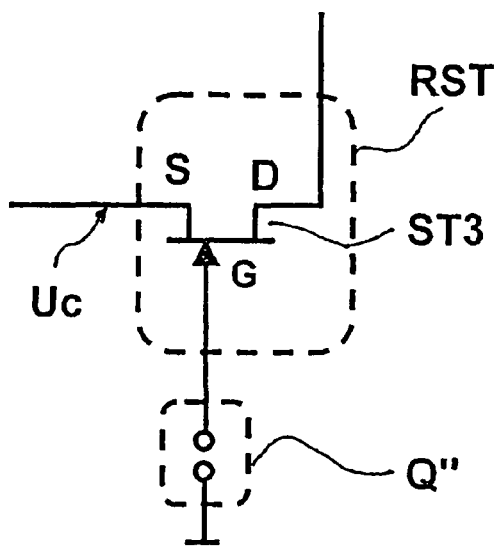
Fig. 17    Fig. 18
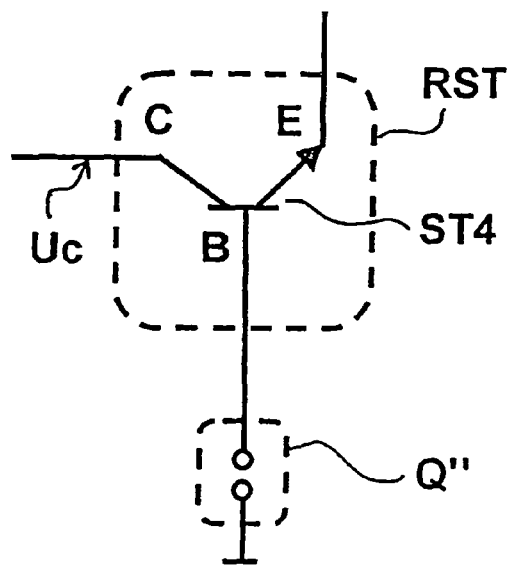
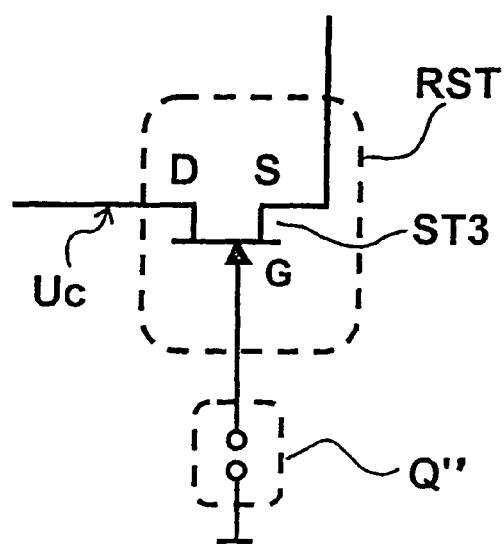
Fig. 19    Fig. 20

OSCILLATOR CIRCUIT AND METHOD FOR INFLUENCING, CONTROLLING, OR REGULATING THE FREQUENCY OF AN OSCILLATOR

FIELD OF THE INVENTION

The invention relates to an oscillator circuit as well as to a method to influence, control or regulate the frequency of an oscillator.

DESCRIPTION OF RELATED ART

The propagation time of an electromagnetic or acoustic signal that has been emitted and reflected back is used in many areas of technology for locating and determining the distance of objects. The foundation for this—with a constant propagation speed of the signal—is the linear relationship between the propagation time of the signal and the path traveled, and thus also the distance of the object. Sound propagation time measurements are used, for example, in echo-sounding methods, in medical ultrasound diagnosis devices, in the monitoring of the filling level of media in containers or in automatically executed manufacturing processes.

The requisite acoustic signals are usually generated by ultrasonic transducers. As ultrasonic transducers, preference is given to the use of special ceramics that, through the application of an alternating voltage using the piezoelectric effect, are excited to generate mechanical oscillations and thus to emit ultrasound.

In order to achieve the highest possible power of the ultrasonic waves generated by the ultrasonic transducer, the frequency of the alternating voltage employed should be identical to the natural frequency, that is to say, to the resonant frequency of the ultrasonic transducer. Therefore, in actual practice, the frequency of the alternating voltage is normally harmonized with the resonant frequency of the ultrasonic transducer.

The alternating voltage is normally generated by an oscillator and subsequently amplified by one or more drivers to the power required to excite the ultrasonic transducer.

However, the resonant frequency of ultrasonic transducers is not constant; on the contrary, for example, due to ageing, soiling or temperature drift of the ultrasonic transducer, it is prone to undergo changes over time that can reach a considerable magnitude; special compensation circuits have been developed in order to counter the temperature drift. Another factor that influences the resonant frequency of the ultrasonic transducer is its installation conditions during operation.

Moreover, manufacturing tolerances of the resonant frequency can play a disruptive role, for example, if an ultrasonic transducer in an acoustic distance-measuring system has to be replaced with another ultrasonic transducer because of a defect. In such cases, due to the usual manufacturing tolerance, the exciting alternating voltage usually has to be re-tuned, which can translate into substantial additional work and correspondingly high costs.

In order to achieve a maximum sound power over the long run, the change in the resonant frequency of the ultrasonic transducer has to be compensated for by re-tuning the oscillator frequency.

Various methods are known for tuning the frequency of the alternating voltage to the resonant frequency of the ultrasonic transducer.

One of these methods is Direct Digital Synthesis (DDS). A drawback here is the high cost of DDS-IC. Another disadvantage of this method is the fact that the frequency signal is usually present as a continuous, harmonic low-level signal oscillation and has to be additionally processed (amplification, square-wave formation, gate circuit for the period of excitation).

Another known method is the use of a combination of a Digital-Analog-Converter (DAC) and an analog voltage-controlled oscillator (VCO). This method is complicated when an external DAC is used.

Another timer is then needed for the ultrasonic propagation time measurement, which restricts the leeway in the programming, especially when simple 8-bit microcontrollers are used.

Another drawback of this method is that the VCO has to additionally be operated in a closed-loop control circuit since the performance characteristic of a regular VCO-IC is unsuitable as a measure of the frequency because of manufacturing tolerances and low constancy.

Another known method comprises frequency generation by the microcontroller itself (with a software loop or by means of a timer). Here, however, only an inadequate frequency resolution of typically approximately 10% is achieved (e.g. microcontroller clock frequency of 4 MHz, ultrasonic transducer resonant frequency of 400 KHz), although a frequency resolution of approximately 0.2% is required or desirable. Other disadvantages include the face that this method can only be implemented with specifically adapted ultrasonic transducers having a minimal manufacturing tolerance or else a severe loss in performance has to be accepted, and also the fact that temperature compensation is not readily possible.

Another method consists of the use of a digital potentiometer as the compensation element. Here, a sufficient frequency resolution would entail higher costs.

Another method consists of the use of an RC oscillator with laser compensation of the frequency-determining resistance. A major drawback here is that only a one-time compensation in one direction (decreasing frequency) is possible.

Another method consists of carrying out a compensation by means of a mechanical potentiometer or trimmer capacitor. This method requires either substantial personnel and time resources or else special equipment, which is only cost-effective if high numbers of items are involved. Another drawback of this method is the mechanical elastic recovery of the compensation element, since the frequency can change of its own accord shortly after the compensation or later.

The two latter methods also entail the disadvantages that the oscillator circuit might become detuned if the electronic elements are cast with cast resin ($\epsilon_\gamma = 2.3$) and that the frequency cannot be controlled by means of software.

Therefore, the invention is based on the objective of putting forward an oscillator circuit as well as a method to influence, control or regulate the frequency of an oscillator which allow a precise change in the frequency at a high resolution and which use very few circuit-related resources, whereby it should also be possible to set the frequency by means of software with equally high precision and resolution, in a simple manner, without transmitting data words to the oscillator.

This objective is achieved according to the invention by an oscillator circuit with an oscillator comprising a toggle circuit, for example, a Schmitt trigger or a multi-vibrator or a relaxation oscillator or an amplifier circuit with hysteresis behavior, having an output and an inverting input, whereby the output is connected to the inverting input via a feedback resistor, the inverting input is connected to a first potential via a first oscillator capacitor, the inverting input is also connected to a second potential via a second oscillator capacitor and via a control resistor that is series-connected to said second oscillator capacitor, and whose value can be adjusted or electrically controlled, so that the frequency of the oscillator can be varied by changing the value of the control resistor.

The objective is also achieved by a method to control or regulate the frequency of an oscillator, whereby the oscillator employed is one that comprises a toggle circuit, for example, a Schmitt trigger or a multi-vibrator or a relaxation oscillator or an amplifier circuit with hysteresis behavior, having an output and an inverting input, whereby the output is connected to the inverting input via a feedback resistor, the inverting input is connected to a first potential via a first oscillator capacitor, the inverting input is also connected to a second potential via a second oscillator capacitor and via a control resistor that is series-connected to said second oscillator capacitor, and whose value can be adjusted or electrically controlled, and the frequency of the oscillator is varied by changing the value of the control resistor.

The first potential can be identical to the second potential. The first and/or the second potential can be potentials that are fixed, that is to say, constant over time, especially the ground. An advantage of such an oscillator circuit in comparison to prior-art oscillator circuits based on the principle of the relaxation oscillator is that the control resistor can be related to a fixed potential, e.g. the ground, and is thus very easy to trigger electronically.

According to one embodiment, the control resistor, instead of being connected to the second potential directly, is connected to the second potential via an interconnected voltage source, and/or the first oscillator capacitor, instead of being connected to the first potential directly, is connected to the first potential via an interconnected voltage source.

Therefore, according to a variant of the method, the control resistor employed is one that, instead of being connected to the second potential directly, is connected to the second potential via an interconnected voltage source, and/or the first oscillator employed is one that, instead of being connected to the first potential directly, is connected to the first potential via an interconnected voltage source.

In particular, the first and/or the second oscillator capacitor and/or the control resistor can each be connected to any potential when it comes to the direct voltage but have to be connected to the ground when it comes to the alternating voltage.

The control resistor is preferably made up of the collector-emitter channel or the drain-source channel of a transistor, which is referred to below as a control transistor, at whose base or gate a control voltage has been applied, so that the second oscillator capacitor is connected to the second potential, especially to the ground, via the collector-emitter channel or via the drain-source channel of the control transistor, and the frequency of the oscillator can be varied by changing the control voltage.

According to an alternative embodiment, the control resistor is formed by the collector-emitter channel of a transistor designated as a control transistor through whose base a control current flows, so that the second oscillator capacitor is connected to the second potential, especially to the ground, via the collector-emitter channel of the control transistor, and the frequency of the oscillator can be varied by changing the control current.

Preferably, the collector-emitter channel or the drain-source channel of a transistor, which is referred to below as a control transistor, is used as the control resistor, so that the second oscillator capacitor is connected to the second potential, especially to the ground, via the collector-emitter channel or via the drain-source channel of the control transistor, whereby a control voltage is applied at the base or gate of the control transistor, and the frequency of the oscillator is varied by changing the control voltage.

According to an alternative variant of the method, the collector-emitter channel of a transistor, control transistor, through whose base a control current flows, is used as the control resistor, so that the second oscillator capacitor is connected to the second potential, especially to the ground, via the collector-emitter channel of the control transistor, and the frequency of the oscillator is varied by changing the control current.

According to one variant, the collector or the drain terminal is connected to the second oscillator capacitor, and the emitter or the source terminal is connected to the second potential.

According to another different advantageous variant, the collector-emitter channel or the drain-source channel of the control transistor is inversely interconnected between the second oscillator capacitor and the second potential, that is to say, the emitter or the source terminal is connected to the second oscillator capacitor, and the collector or drain terminal is connected to the second potential. Therefore, according to the method, the collector-emitter channel or the drain-source channel of the control transistor is operated inversely. By inversely operating the control transistor, an improved starting performance can be achieved.

The control transistor does not necessarily have to be operated as a common emitter or common source. Instead, it can be operated as a common base or common gate. Therefore, according to one variant, the control resistor is made up of the collector-emitter channel or the drain-source channel of a transistor, control transistor, at whose emitter or source a control voltage has been applied and whose base or gate is connected to a third potential, so that the second oscillator capacitor is connected to the control voltage via the collector-emitter channel or the drain-source channel of the control transistor, and thus the control transistor is connected as a common base or common gate, and the frequency of the oscillator can be varied by changing the control voltage. In this case, the control voltage and the second potential are identical to each other.

The control resistor can be made up of the collector-emitter channel or the drain-source channel of a transistor, control transistor, at whose emitter or source a control voltage is applied, and whose base or gate is connected to a third potential, so that the second oscillator capacitor is connected to the second potential via the collector-emitter channel or the drain-source channel of the control transistor, and thus the control transistor is operated as a common base or common gate, whereby the frequency of the oscillator is varied by changing the control voltage. In this case, the control voltage and the second potential are identical to each other.

The control transistor can also be operated inversely as a common base, that is to say, control voltage can be applied to the collector or to the drain terminal, and the second oscillator capacitor can be connected to the emitter or to the source terminal of the control transistor. Here, the base or gate terminal is connected to the preferably fixed third potential.

According to a very advantageous embodiment, the value of the control resistor and thus the frequency of the oscillator can be influenced, controlled or regulated via a modulated 1-bit signal, especially via a pulse width modulation. Therefore, according to one variant of the method, the value of the control resistor and thus the frequency of the oscillator are influenced, controlled or regulated via a modulated 1-bit signal, especially via a pulse width modulation.

If, for example, the collector-emitter channel or the drain-source channel of a control transistor is used as the control resistor, then the control voltage and thus the frequency of the oscillator can especially advantageously be influenced, controlled or regulated via a modulated 1-bit signal, especially via a pulse width modulation. Therefore, according to the method, the control voltage and thus the frequency of the oscillator can be influenced, controlled or regulated via a modulated 1-bit signal, especially via a pulse width modulation.

According to a preferred variant, the control resistor employed is one whose base or gate is connected to the output of an integrator whose input is connected to the trigger output of a trigger circuit, whereby
 the trigger circuit employed is one that is capable of delivering a trigger signal to the input of the integrator via the trigger output, said trigger signal being either equal to or smaller than a first voltage value or equal to or greater than a second voltage value, whereby the first voltage value is smaller than the second voltage value, and
 the integrator employed is one that is capable of integrating the trigger signal into the control voltage and of delivering it to the base or gate of the control transistor via the output of the integrator,
and whereby either
 the control voltage can be lowered in that the trigger circuit is controlled in such a way that the trigger signal is equal to or smaller than the first voltage value,
 and the control voltage can be raised in that the trigger circuit is controlled in such a way that the trigger signal is equal to or greater than the second voltage value,
or vice versa, so that the frequency of the oscillator or its rate of change is influenced or controlled by the trigger signal.
 In this context, various scenarios are possible:
(i) If the integrator is a non-inverting integrator and if the oscillator is one whose frequency increases as the control voltage rises, then the control voltage is lowered and thus the frequency of the oscillator is likewise decreased, in that the trigger circuit is controlled in such a way that the trigger signal is equal to or smaller than the first voltage value, and the control voltage is raised and thus the frequency of the oscillator is likewise increased, in that the trigger circuit is controlled in such a way that the trigger signal is equal to or greater than the second voltage value.
(ii) If the integrator is a non-inverting integrator and if the oscillator is one whose frequency decreases as the control voltage rises, then the control voltage is lowered and thus the frequency of the oscillator is increased, in that the trigger circuit is controlled in such a way that the trigger signal is equal to or smaller than the first voltage value, and the control voltage is raised and thus the frequency of the oscillator is decreased, in that the trigger circuit is controlled in such a way that the trigger signal is equal to or greater than the second voltage value.
(iii) If the integrator is an inverting integrator and if the oscillator is one whose frequency increases as the control voltage rises, then the control voltage is raised and thus the frequency of the oscillator is likewise increased, in that the trigger circuit is controlled in such a way that the trigger signal is equal to or smaller than the first voltage value, and the control voltage is lowered and thus the frequency of the oscillator is likewise decreased, in that the trigger circuit is controlled in such a way that the trigger signal is equal to or greater than the second voltage value.
(iv) If the integrator is an inverting integrator and if the oscillator is one whose frequency decreases as the control voltage rises, then the control voltage is raised and thus the frequency of the oscillator is decreased, in that the trigger circuit is controlled in such a way that the trigger signal is equal to or smaller than the first voltage value, and the control voltage is lowered and thus the frequency of the oscillator is increased, in that the trigger circuit is controlled in such a way that the trigger signal is equal to or greater than the second voltage value.

According to a preferred variant of the oscillator circuit, the base or gate of the control transistor is connected to the output of an integrator whose input is connected to the trigger output of a trigger circuit, whereby
 the trigger circuit is capable of delivering a trigger signal to the input of the integrator via the trigger output, said trigger signal being either equal to or smaller than a first voltage value or equal to or greater than a second voltage value, whereby the first voltage value is smaller than the second voltage value, and
 the integrator is capable of integrating the trigger signal into the control voltage and of delivering it via the output of the integrator to the base or gate of the control transistor,
so that either the control voltage drops if the trigger signal is equal to or smaller than the first voltage value, and then the control voltage rises if the trigger signal is equal to or greater than the second voltage value, or vice versa, and thus the frequency of the oscillator or its rate of change can be influenced or controlled by the trigger signal.

According to one embodiment of the oscillator circuit, the trigger signal is a pulse-modulated 1-bit signal that alternates essentially like a square wave between the first and second voltage values, so that either the control voltage can be lowered in that the mean value of the trigger signal is decreased by correspondingly changing the time sequence of the first and second voltage values, and the control voltage can be raised in that the mean value of the trigger signal is increased by correspondingly changing the time sequence of the first and second voltage values or—for example, in the case of an inverting integrator—vice versa, and thus the frequency of the oscillator or its rate of change can be influenced or controlled via the pulse-modulated 1-bit signal.

Therefore, according to a variant of the method, a pulse-modulated 1-bit signal that alternates essentially like a square wave between the first and second voltage values is used as the trigger signal, so that either the control voltage can be lowered in that the mean value of the trigger signal is decreased by correspondingly changing the time sequence of the first and second voltage values, and the control voltage can be raised in that the mean value of the trigger signal is increased by correspondingly changing the time sequence of the first and second voltage values or—for example, in the case of the use of an inverting integrator—vice versa, and thus the frequency of the oscillator or its rate of change is influenced or controlled via the pulse-modulated 1-bit signal, for example, by changing its mean value.

In particular, the trigger signal can be a pulse-modulated 1-bit signal that alternates essentially like a square wave with a variable pulse-duty factor between the first and second voltage values, whereby the mean value of said signal can be varied by correspondingly changing the pulse-duty factor, so that the pulse-modulated 1-bit signal is a pulse-width-modulated signal for influencing or controlling the frequency, and consequently the frequency of the oscillator or its rate of change can be influenced or controlled by a pulse width modulation.

Therefore, according to the method, a pulse-modulated 1-bit signal that oscillates essentially like a square wave with a variable pulse-duty factor between the first and second voltage values can be used as the trigger signal, whereby the mean value of said signal can be varied by correspondingly changing the pulse-duty factor, so that the frequency of the oscillator or its rate of change is influenced or controlled by a pulse-width modulation.

Preferably, the pulse-duty factor can be varied steplessly or in small increments between 0% and 100%, so that the rate of change of the control voltage can be selected or influenced through an appropriate selection of the pulse-duty factor.

According to an especially simple embodiment, the integrator comprises the following components:
    a first integrator resistor that is interconnected between the trigger output and the base or gate of the control transistor, and
    a first integrator capacitor via which the base or gate of the control transistor is connected to a preferably fixed potential, especially to the ground.

The fixed potential does not necessarily have to be identical to the first or second fixed potentials.

According to another embodiment, the integrator comprises the following components:
    an integrator transistor,
    a second integrator resistor,
    a first series resistor,
    a second integrator capacitor as well as
    an external additional voltage source
whereby
    the second integrator resistor is interconnected between the trigger output and the base or gate of the integrator transistor,
    the base or gate of the integrator transistor is connected to a preferably fixed potential, especially to the ground via the second integrator capacitor,
    one pole of the additional voltage source is connected to the base or gate of the control transistor via the collector-emitter channel or the drain-source channel of the integrator transistor and via the first series resistor,
    the other pole of the additional voltage source is connected to the ground,
    and the collector-emitter channel or the drain-source channel of the integrator transistor is connected in the conducting direction of the current initiated by the additional voltage source.

According to another embodiment, the integrator comprises the following components:
    an integrator transistor,
    a third, fourth and fifth integrator resistor,
    a second series resistor,
    a third integrator capacitor as well as
    an external additional voltage source
whereby
    the third integrator resistor is interconnected between the trigger output and the base or gate of the integrator transistor,
    the base or gate of the integrator transistor is connected to the ground or to another preferably fixed potential via the fourth integrator capacitor,
    the collector or drain of the integrator transistor is connected
        to a pole of the additional voltage source via the fifth integrator resistor,
        to the base or gate of the integrator transistor via the third integrator capacitor,
        to the base or drain of the control transistor via the second series resistor,
    the other pole of the additional voltage source is connected to the ground,
    the emitter or the source terminal of the integrator transistor is connected to the ground or to another fixed potential, and
    the collector-emitter channel or the drain-source channel of the integrator transistor is connected in the conducting direction of the current initiated by the additional voltage source.

According to an advantageous embodiment of the invention, the trigger circuit has an input that is connected to the output of the toggle circuit or of the Schmitt trigger, and said trigger circuit is capable of detecting the frequency of the oscillator via the input and of influencing it by means of the trigger signal in such a way that the frequency of the oscillator decreases if it is greater than a predefinable target frequency and it increases if it is smaller than the target frequency, so that the oscillator is a regulated oscillator. Therefore, the trigger circuit is preferably configured at the same time as a frequency measuring device. For this purpose, it can comprise, for example, a frequency counter or it can be configured as a computer means, especially a microcontroller, that is capable of functioning as a frequency measuring device.

One variant of the method is characterized in that the trigger circuit employed is one that has an input that is connected to the output of the toggle circuit or of the Schmitt trigger, via which the frequency of the oscillator is detected, whereby the frequency of the oscillator is influenced by means of the trigger signal in such a way that it decreases if it is greater than a predefinable target frequency and it increases if it is smaller than the target frequency, so that the frequency of the oscillator is regulated via the trigger circuit.

In this preferred variant, the oscillator frequency is compared to the target frequency and the trigger signal is adjusted accordingly, that is to say, the control signal depends on the result of this comparison: if the oscillator frequency is greater than the target frequency, the trigger signal is set in such a way that the oscillator frequency decreases; if the oscillator frequency is smaller than the target frequency, the trigger signal is set in such a way that the oscillator frequency increases. Thus the oscillator is a regulated oscillator.

Here, various scenarios are possible:

(i) If the integrator is a non-inverting integrator and if the oscillator is one whose frequency increases as the control voltage rises, then a voltage that is equal to or smaller than the first voltage value is applied as a trigger signal to the integrator via the trigger output, and thus the frequency of the oscillator is decreased if it is greater than a predefinable target frequency, and otherwise, a voltage that is equal to or greater than the second voltage value is applied as a trigger signal to the integrator and thus the frequency of the oscillator is increased.

(ii) If the integrator is a non-inverting integrator and if the oscillator is one whose frequency decreases as the control voltage rises, then a voltage that is equal to or smaller than the first voltage value is applied as a trigger signal to the integrator via the trigger output, and thus the frequency of the oscillator is increased if it is smaller than a predefinable target frequency, and otherwise, a voltage that is equal to or greater than the second voltage value is applied as a trigger signal to the integrator and thus the frequency of the oscillator is decreased.

(iii) If the integrator is an inverting integrator and if the oscillator is one whose frequency increases as the control voltage rises, then a voltage that is equal to or smaller than the first voltage value is applied as a trigger signal to the integrator via the trigger output, and thus the frequency of the oscillator is increased if it is smaller than a predefinable target frequency, and otherwise, a voltage that is equal to or greater than the second voltage value is applied as a trigger signal to the integrator and thus the frequency of the oscillator is decreased.

(iv) If the integrator is an inverting integrator and if the oscillator is one whose frequency decreases as the control voltage rises, then a voltage that is equal to or smaller than the first voltage value is applied as a trigger signal to the integrator via the trigger output, and thus the frequency of the oscillator is decreased if it is greater than a predefinable target frequency, and otherwise, a voltage that is equal to or greater than the second voltage value is applied as a trigger signal to the integrator and thus the frequency of the oscillator is increased.

Consequently, the trigger circuit receives the frequency of the oscillator as the input variable and the oscillator is regulated via the trigger circuit.

The frequency of the oscillator can be detected especially at time intervals or at certain times. By the same token, the changes in the frequency of the oscillator can take place at time intervals, for example, always after a comparison of its frequency to the target frequency. Each of these changes can be made, for example, stepwise.

According to an embodiment of the oscillator circuit, the trigger circuit is capable of changing the time sequence of the first and second voltage values in such a way that the frequency of the oscillator decreases if the frequency of the oscillator is greater than the predefinable target frequency, and the frequency of the oscillator increases if the frequency of the oscillator is smaller than the predefinable target frequency, so that the oscillator is an oscillator that is regulated via a pulse modulation.

Preferably, the control or regulation actions that are carried out after a comparison of the frequency of the oscillator to the target frequency such as, for example, a change in the trigger signal, are carried out or triggered at time intervals.

Preferably, the trigger signal is one that consists exclusively of a sequence of the first and second voltage values, and thus it is preferably a binary signal.

The time sequence of the first and second voltage values can be changed in such a way that the frequency of the oscillator decreases if the frequency of the oscillator is greater than the predefinable target frequency, and the frequency of the oscillator increases if the frequency of the oscillator is smaller than the predefinable target frequency, so that the oscillator is regulated via a pulse modulation.

The pulse modulation can especially be a pulse width modulation. Advantageously, due to the pulse modulation between the trigger circuit and the integrator, only the transmission of the trigger signal is necessary, i.e. the oscillator is preferably controlled exclusively by the time sequence of two voltage values, for which purpose advantageously one single line is sufficient and no recognition of data words etc. is necessary. Therefore, the pulse modulation allows a highly precise control or regulation of the oscillator frequency with a very high frequency resolution and yet extremely little effort.

According to an embodiment of the oscillator circuit according to the invention, the trigger circuit has a computer means comprising the following components:

a first binary connection that emits a first binary signal and that is connected to the trigger output via a first feed line in which a first intermediate resistor is interconnected, a second binary connection that emits a second binary signal and that is connected to the trigger output via a second feed line in which a first diode and a second intermediate resistor series-connected downstream from said first diode are interconnected, whereby the second intermediate resistor has a smaller value than the first intermediate resistor, and the anode of the first diode is connected to the second binary connection and the cathode of the first diode is connected to the second intermediate resistor, a third binary connection that emits a third binary signal and that is connected to a third feed line that branches off from the second feed line between the first diode and the second intermediate resistor and in which feed line a second diode is interconnected whose cathode is connected to the third binary connection and whose anode is connected to the cathode of the first diode, whereby a) the first, second and third binary signals are each a high-signal or a low-signal or a time sequence of such signals, b) the first binary connection emits a high-signal if the frequency of the oscillator is smaller than the target frequency, and otherwise, it emits a low-signal, or vice versa, and c) the trigger circuit can be set into a first mode, fast mode, in which the second and the third binary connections each emit a high-signal when the first binary connection emits a high-signal, and each emit a low-signal when the first binary connection emits a low-signal, so that the integrator is capable of integrating the trigger signal having a first time constant, into the control voltage, and can be set into a second mode, slow mode, in which the second binary connection always emits a low-signal and the third binary connection always emits a high-signal, so that the integrator is capable of integrating the trigger signal having a second time constant that is greater than the first time constant, into the control voltage.

Therefore, according to an advantageous variant of the method, the trigger circuit employed is one that has a computer means comprising the following components:

a first binary connection that emits a first binary signal and that is connected to the trigger output via a first feed line in which a first intermediate resistor is interconnected, a second binary connection that emits a second binary signal and that is connected to the trigger output via a second feed line in which a first diode and an intermediate resistor series-connected down-stream from said first diode are interconnected, whereby the second intermediate resistor has a smaller value than the first intermediate resistor, and the anode of the first diode is connected to the second binary connection and the cathode of the first diode is connected to the second intermediate resistor, a third binary connection that emits a third binary signal and that is connected to a third feed line that branches off from the second feed line between the first diode and the second intermediate resistor and in which feed line a second diode is interconnected whose cathode is connected to the third binary connection and whose anode is connected to the cathode of the first diode, whereby a) the first, second and third binary signals are each a high-signal or a low-signal or a time sequence of such signals,
b) the first binary connection emits a high-signal if the frequency of the oscillator is smaller than the target frequency, and otherwise, it emits a low-signal, or vice versa, and
c) the trigger circuit
   can be set into a first mode, fast mode, in which the second and the third binary connections
      each emit a high-signal when the first binary connection emits a high-signal,
      and each emit a low-signal when the first binary connection emits a low-signal,
   so that the integrator is capable of integrating the trigger signal having a first time constant, into the control voltage,
   and can be set into a second mode, slow mode, in which the second binary connection always emits a low-signal and the third binary connection always emits a high-signal, so that the integrator is capable of integrating the trigger signal having a second time constant that is greater than the first time constant, into the control voltage.

Thus, the trigger circuit is in the fast mode when the second and the third binary signals are both high-signals or are both low-signals, and in the slow mode when the second binary signal is a low-signal and the third binary signal is a high-signal. Therefore, the time constant of the integration can advantageously be switched over by means of software.

In a preferred manner, after the trigger circuit has been switched on or reset, it is first automatically set into the fast mode and
   after a certain period of time
   or if the frequency of the oscillator has fallen below a predefined distance from the target frequency,
   or if the frequency of the oscillator has reached a predefined frequency range,
said trigger circuit is set into the slow mode.

According to a preferred embodiment of the oscillator circuit according to the invention, after the trigger circuit has been switched on or reset, it is capable of first autonomously setting itself into the fast mode and
   after a certain period of time
   or if the frequency of the oscillator has fallen below a predefined distance from the target frequency,
   or if the frequency of the oscillator has reached a predefined frequency range,
of setting itself into the slow mode.

According to one embodiment, the integrator is either a non-inverting integrator that additionally has an inverting integrator input to which a reference voltage is applied, or it is an inverting integrator that additionally has a non-inverting integrator input to which a reference voltage is applied.

Therefore, according to a variant of the method, as the integrator, either a non-inverting integrator that additionally has an inverting integrator input to which a reference voltage is applied is used, or else an inverting integrator that additionally has a non-inverting integrator input to which a reference voltage is applied is used.

According to one variant, the reference voltage that is applied to the additional integrator input is such that it is equal to the arithmetic mean value from the first and second voltage values. Thus, the reference voltage can especially be equal to the arithmetic mean value from the first and second voltage values.

The reference voltage can serve to symmetrize the time behavior of the integrator when the first voltage value is applied relative to its time behavior when the second voltage value is applied.

The frequency of an alternating voltage, especially the decay frequency of an ultrasonic transducer, can be used as the target frequency.

Therefore, according to an embodiment of the invention, the trigger circuit has another input and, via this input, it is capable of detecting the frequency of an alternating voltage, especially the decay frequency of an ultrasonic transducer, and of taking it as the target frequency.

Below, preferred embodiments of the invention will be explained, making reference to the figures.

Brief description of the drawing in which the following is shown schematically:

FIG. 1 an oscillator circuit according to the invention, with a variable resistor $R_{var}$ according to an embodiment of the invention, FIG. 2 a block diagram of a voltage-controlled or current-controlled oscillator circuit according to the invention, with a control resistor to which an integrator is connected according to a preferred embodiment of the invention, FIGS. 3-5 various embodiments of integrators and control resistors that can be used in the circuit of FIG. 2 as an integrator or as a control resistor, FIG. 6 the oscillator circuit of FIG. 2, together with a trigger circuit that, in the example of FIG. 6, is a computer means, FIG. 7 an oscillator circuit according to the invention, with a trigger circuit, an oscillator and an integrator, FIG. 8 an example for correcting a frequency deviation by means of the oscillator circuit of FIG. 7, FIG. 9 an embodiment of the variable resistor $R_{var}$ of FIG. 1, with an integrator connected thereto, FIG. 10 an embodiment of the variable resistor $R_{var}$ of FIG. 1, with another integrator connected thereto, FIG. 11 an embodiment of the variable resistor $R_{var}$ of FIG. 1, with yet another integrator connected thereto, FIG. 12 a trigger circuit that allows the integration time, for example, of the integrator of FIG. 1, to be influenced, FIGS. 13-20 various embodiments of control resistors that can be used in an oscillator according to the invention, each as a variable resistor or as a control resistor, and FIG. 21 a table.

FIG. 1 shows an embodiment of the oscillator circuit according to the invention, with a variable resistor $R_{var}$ according to an embodiment of the invention. The oscillator circuit of FIG. 1 consists of an oscillator 112 that is also referred to below as a VCO (voltage-controlled oscillator) and that comprises a Schmitt trigger 3 having an output A and an inverting input E−. The output A is connected to the inverting input E− via a feedback resistor RR. The inverting input E− is connected to the ground via a first oscillator capacitor OC1. Moreover, the inverting input E− is also connected to the ground via a second oscillator capacitor OC2 and via a control resistor $R_{var}$ that is series-connected to said second oscillator capacitor, and whose value $R_{var}$ can be adjusted or electrically controlled. Consequently, the frequency f of the oscillator 112 can be varied by changing the value of the control resistor $R_{var}$: when the value of $R_{var}$ drops, the frequency f decreases, and when the value of $R_{var}$ rises, the frequency f increases.

According to a preferred variant, which is illustrated in FIG. 1, the principle of a Schmitt trigger/integrator is used, although, however, due to the special circuitry solution, the variable or adjustable, preferably controllable, resistor $R_{var}$ works against a preferably fixed reference potential, e.g. the ground, and is thus easy to trigger.

Features of the VCO according to the invention shown in FIG. 1 are:
  division of the frequency-determining capacity C into preferably two partial capacities OC1 and OC2,
  part of the frequency-determining capacity is series-connected to a controllable resistor $R_{var}$,
  $R_{var}$ is related to a fixed potential.

In this context, other oscillator basic circuits (e.g. LC oscillators, phase-shifting oscillators) can be used.

The voltage-controlled or current-controlled oscillator according to the invention shown in FIG. 1 consists of an inverting Schmitt trigger 3 (e.g. Schmitt trigger inverter from various logic families or timer-IC x555) that is back-coupled via the integration member RR, OC1∥ (OC2+$R_{var}$). The expression RR, OC1∥ (OC2+$R_{var}$) here means that the above-mentioned integration member comprises the resistor RR and the capacitor OC1 as well as, connected in parallel thereto, a series connection consisting of the capacitor OC2 and the variable resistor $R_{var}$. The inverting Schmitt trigger 3 is back-coupled via the resistor RR, whereby the input of the inverting Schmitt trigger 3 is connected to the ground via OC1 as well as via the series connection consisting of OC2 and $R_{var}$.

The charging current of OC1∥ (OC2+$R_{var}$) causes a voltage drop via RR so that, after the trigger output has toggled, the other trigger threshold is reached with a corresponding delay.

Here, the expression OC1∥ (OC2+$R_{var}$) means that the capacitor OC1 is connected in parallel to the series connection consisting of the capacitor OC2 and the variable resistor $R_{var}$. This delay time determines the frequency of the unstable toggle circuit. In the ideal case of R=0 (this means that OC1∥OC2, i.e. OC1 is connected in parallel to OC2) all the way to R→∞ (OC2 is then inactive), $R_{var}$ is steplessly adjustable. In accordance with the value of $R_{var}$, a current flows through OC2 that is added to the current through OC1 and thus, together with the latter, determines the delay time.

Hence, by adjusting the value of $R_{var}$, the frequency of the toggle circuit is steplessly adjustable within a range determined by the ratio of OC1 to OC2 and by the resistor adjustment range of $R_{var}$.

For example, JFET and bipolar transistors are suitable as electronically controllable resistors $R_{var}$.

FIG. 2 schematically shows a block diagram of another embodiment of an oscillator circuit according to the invention, having an oscillator 212 to which, according to a preferred embodiment of the invention, an integrator 211 is connected whose function is explained below. The integrator 211 can be realized in various embodiments; the integrators 211A (FIG. 3), 211B (FIG. 4) and 211C (FIG. 5) are examples of embodiments of the integrator 211.

The oscillator 212 comprises a toggle stage or an amplifier with hysteresis behavior or a relaxation oscillator—configured as a Schmitt trigger 3 in the example of FIG. 2—having an output A and an inverting input E−. The output A of the Schmitt trigger 3 is connected to the inverting input E− via the feedback resistor RR. The inverting input E− is connected to the ground via the first oscillator capacitor OC1 and also connected to the ground via the second oscillator capacitor OC2 and via a control resistor RST whose value can be adjusted or electrically controlled. Instead of the ground or ground potential, it is also generally possible to have another, preferably fixed, potential as the reference potential.

The frequency of the oscillator 212 can be raised by increasing the value of the control resistor RST and it can be lowered by decreasing the value of the control resistor RST.

The control resistor can be, for example, an adjustable resistor—trimmer—or, for example, a photoresistor; these cases do not correspond to the oscillator circuit of FIG. 2 since the control resistor RST of FIG. 2 is an electrically controllable resistor with a control input EST. The value of the control resistor RST of FIG. 2 can be controlled by applying a control voltage Uc to the control input EST. Thus, the frequency of the oscillator 212 is also electrically controllable.

In principle, the control voltage Uc can be supplied by any voltage source or current. In the embodiment of FIG. 2, the integrator 211 serves to generate the control voltage Uc, and said integrator 211, like the control resistor RST, is not shown in detail in FIG. 2 but rather is only depicted in the form of a placeholder. FIGS. 3 to 5 and 13 to 20 show various embodiments of integrators 211A, 211B, 211C and control resistors ST1, ST2, ST3, ST4, which can be used in the circuit of FIG. 2 as the integrator 211 or as the control resistor RST.

According to a preferred embodiment of the invention, the integrator 211 has, for instance, a non-inverting input IE that is connected, for example, via a terminal KL3, to the trigger output BA of a trigger circuit 210 (FIG. 6), which is not shown in FIGS. 2 to 5. This trigger circuit 210 is capable of delivering a trigger signal OUT1 to the input IE of the integrator 211 via the trigger output BA, said trigger signal being the same as either a first or a second voltage value U1, U2 and thus consisting of a time sequence of these voltage values U1, U2, whereby the first voltage value U1 is smaller than the second voltage value U2. The integrator 211 integrates the trigger signal OUT1 into the control voltage Uc and delivers it via the output IA to the control input EST of the control resistor RST, that is to say, to the base or gate of the control transistor ST1. The integrator 211 is thus triggered with the trigger signal OUT1 and supplies the control voltage Uc.

On the basis of the integration of the trigger signal OUT1 by the integrator 211, the control voltage Uc drops when the trigger signal OUT1 is equal to the first voltage value U1, and the control voltage Uc rises when the trigger signal OUT1 is equal to the second voltage value U2, or vice versa. In both cases, due to the change in the value of the control resistor RST, the frequency f of the oscillator 212 changes. For example, the control resistor can be configured in such a way that it becomes higher-ohmic when the control voltage Uc drops, and lower-ohmic when the control voltage Uc rises, or vice versa.

Therefore, the control voltage Uc depends on the time sequence of the first and second voltage values U1, U2 in the trigger signal OUT1, i.e. the frequency of the oscillator 212 can advantageously be controlled by this time sequence.

The control resistor RST, instead of being connected to the ground directly, can be connected to the ground (see, for example, FIG. 3) via an interconnected voltage source Q (not shown in FIG. 2).

The integrator can additionally have an inverting input (not shown in FIGS. 2 to 5) to which a reference voltage Uo is applied, which is preferably equal to the arithmetic mean value from the first and second voltage values U1, U2. The reference voltage Uo can especially serve to symmetrize the time behavior of the integrator when the first voltage value U1 is applied relative to its time behavior when the second voltage value U2 is applied.

The control resistor RST can be made up, for example, of the collector-emitter channel or the drain-source channel of a transistor ST1, which is referred to below as the control transistor (FIG. 3), so that the second oscillator capacitor OC2 is connected to the ground via the collector-emitter channel or the drain-source channel of the control transistor ST1, whereby the control resistor ST1 in the example of FIG. 3—unlike that of FIG. 2—is not connected to the ground directly but rather via an interconnected voltage source Q.

When the control resistor RST is formed by the collector-emitter channel of a bipolar transistor, then its base functions as the control input EST. When the control resistor RST is formed by the drain-source channel of a field-effect transistor, then its gate functions as the control input EST. In the circuit of FIG. 3, the frequency of the oscillator 212 can be decreased by raising the control voltage Uc that has been applied at the base or gate of the control transistor ST1 and can be increased by lowering the control voltage Uc that has been applied at the base or gate of the control transistor ST1.

The base or gate of the control transistor ST1 of FIG. 3 is connected to the output IA of the integrator 211.

The integrator 211A of FIG. 3, which is an example of an embodiment of the integrator 211 of FIG. 2, consists merely of a first integrator resistor IR1 that is interconnected between the integrator input IE and the base or gate of the control transistor ST1, and of a first integrator capacitor IC1, via which the base or gate of the control transistor ST1 is connected to the ground. In other words, the integrator 211A of FIG. 3 is a simple RC low-pass filter.

FIG. 4 shows an integrator 211B which is another example of an embodiment of the integrator 211 of FIG. 2. The integrator 211B of FIG. 4 comprises the following components: an integrator transistor IT, a second integrator resistor IR2, a first series resistor VR1, a second integrator capacitor IC2 and an external additional voltage source Q'. The control resistor RST is configured as a control transistor ST2.

The second integrator resistor IR2 is interconnected between the integrator input IE and the base or gate of the integrator transistor IT. The base or gate of the integrator transistor IT is connected to the ground via the second integrator capacitor IC2, that is to say, an RC low-pass filter IR2, IC2 is connected upstream from the integrator transistor IT. One pole of the additional voltage source Q' is connected to the base or gate of the control transistor ST2 via the collector-emitter channel or the drain-source channel of the integrator transistor IT and via the first series resistor VR1. The other pole of the additional voltage source Q' is connected to the ground. The collector-emitter channel or the drain-source channel of the integrator transistor IT is connected in the conducting direction of the current initiated by the additional voltage source Q'.

FIG. 5 shows an integrator 211C that is another example of an embodiment of the integrator 211 of FIG. 2. The integrator 211C of FIG. 5 comprises the following components: the integrator transistor IT of FIG. 4, a third, a fourth and a fifth integrator resistor IR3, IR4, IR5, a second series resistor VR2, a third integrator capacitor IC3 as well as the external additional voltage source Q'. The control resistor RST is configured as a control transistor ST2.

The third integrator resistor IR3 is interconnected between the integrator input IE and the base or gate of the integrator transistor IT. This is connected to the ground (or to another fixed potential) via the fourth integrator resistor IR4. The collector or drain of the integrator transistor IT is connected to a pole of the additional voltage source Q' via the fifth integrator resistor IR5, also to the base or gate of the integrator transistor IT via the third integrator capacitor IC3 as well as finally to the base or drain of the control transistor ST2 via the second series resistor VR2. The third integrator capacitor IC3 brings about a negative feedback of the integrator transistor IT that increases with the frequency and thus an active low-pass filter. The other pole of the additional voltage source Q' is connected to the ground. The emitter or source terminal of the integrator transistor IT is connected to the ground (or to another fixed potential).

The collector-emitter channel or the drain-source channel of the integrator transistor IT is connected in the conducting direction of the current initiated by the additional voltage source Q'.

The control resistor RST or the control transistors ST1 and ST2, instead of being connected to the ground directly, can be connected to the ground via an interconnected voltage source Q that is not shown in FIGS. 2, 4 and 5.

According to a modification of the circuit of FIG. 3, the drain and the source of the control transistor ST1 are switched with each other as compared to the circuit of FIG. 3, so that the control transistor ST1 is operated inversely.

According to another modification of the circuit of FIG. 3, the gate and the source of the control transistor ST1 are switched with each other as compared to the circuit of FIG. 3, so that the control transistor ST1 is operated as a common gate.

According to a modification of the circuit of FIG. 4 or 5, the collector and the emitter of the control transistor ST2 are switched with each other as compared to the circuit of FIG. 4 or 5, so that the control transistor ST2 is operated inversely.

According to another modification of the circuit of FIG. 4 or 5, the base and the emitter of the control transistor ST1 are switched with each other as compared to the circuit of FIG. 4 or 5, so that the control transistor ST1 is operated as a common base.

FIGS. 13 to 20 illustrate various embodiments of control resistors RST that can each be used in an oscillator 112, 212 according to the invention as a variable resistor $R_{var}$ or as a control resistor RST. In FIGS. 13 to 20, the terminal leading upwards out of the control resistor RST is connected to the second oscillator capacitor OC2; in each case, the control voltage Uc is applied to the terminal leading out towards the left.

Figure 13:
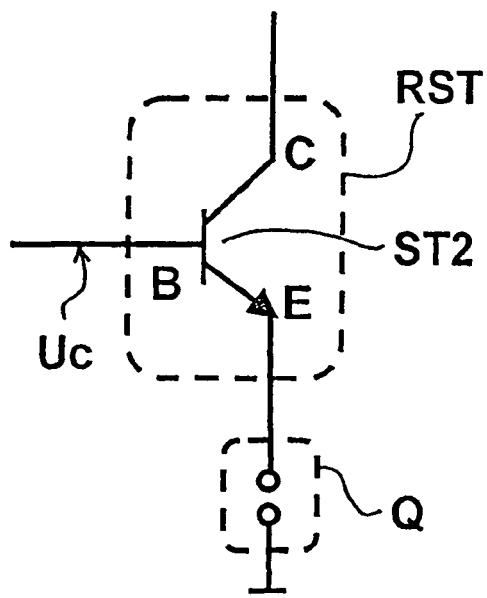
FIG. 13 shows a transistor ST2 whose collector C is connected to the second oscillator capacitor OC2 and to whose base B the control voltage Uc is applied. The emitter is preferably connected to the ground directly or via the voltage source Q.
Figure 15:
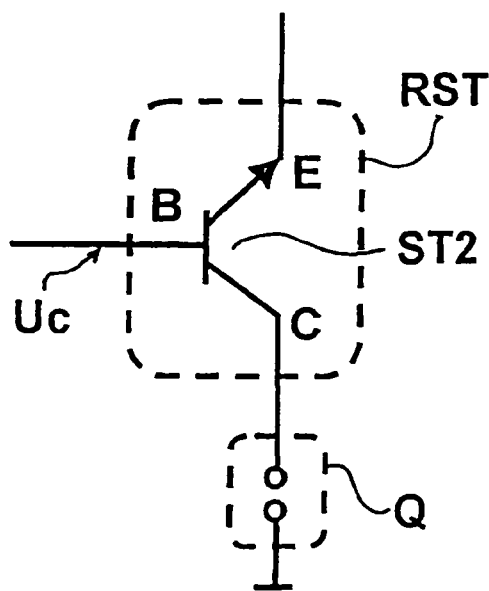

The circuit of FIG. 15 differs from the circuit of FIG. 13 in that, in FIG. 15, the control transistor ST2 is connected inversely: the emitter E is connected to the second oscillator capacitor OC2 and the collector C is preferably connected to the ground directly or via the voltage source Q.

Figure 14:
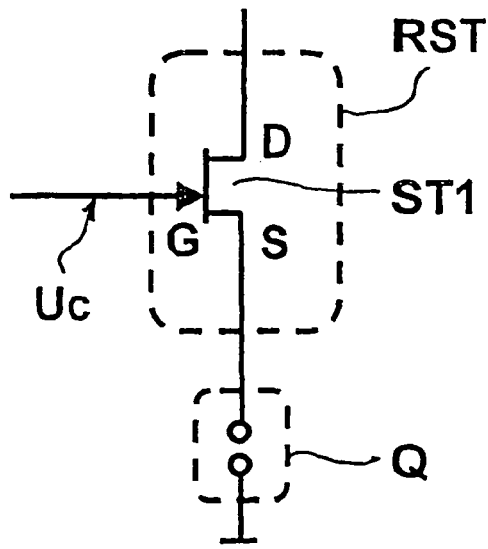
FIG. 14 shows a control FET ST1 whose drain terminal D is connected to the second oscillator capacitor OC2 to whose gate terminal G the control voltage Uc is applied. The source terminal S is preferably connected to the ground directly or via the voltage source Q.
Figure 16:
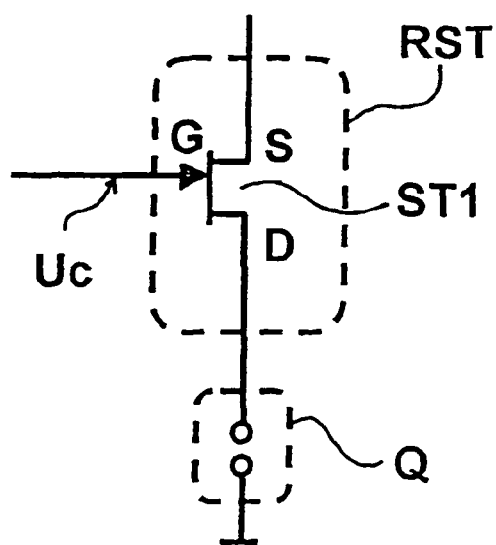

The circuit of FIG. 16 differs from the circuit of FIG. 14 in that, in FIG. 16, the control FET ST1 is connected inversely: the source terminal is connected to the second oscillator capacitor OC2 and the drain terminal D is preferably connected to the ground directly or via the voltage source Q.

FIG. 17 shows a transistor ST4 as a common base whose collector C is connected to the second oscillator capacitor OC2 to whose emitter E the control voltage Uc is applied. The base B is connected to a voltage source Q".

FIG. 18 shows a control FET ST3 as a common gate whose drain terminal D is connected to the second oscillator capacitor OC2 to whose source terminal the control voltage Uc is applied. The gate terminal G is connected to a voltage source Q".

In FIG. 19, the control transistor ST4 is likewise inversely connected as a common base, but inversely with respect to FIG. 17: the emitter E is connected to the second oscillator capacitor OC2 and the control voltage is applied to the collector C. The base B is connected to the voltage source Q".

In FIG. 20, the control FET ST3 is likewise connected as a common gate, but inversely with respect to FIG. 19: the source terminal S is connected to the second oscillator capacitor OC2 and the control voltage is applied to the drain terminal D. The gate terminal G is connected to the voltage source Q".

Figure 6:
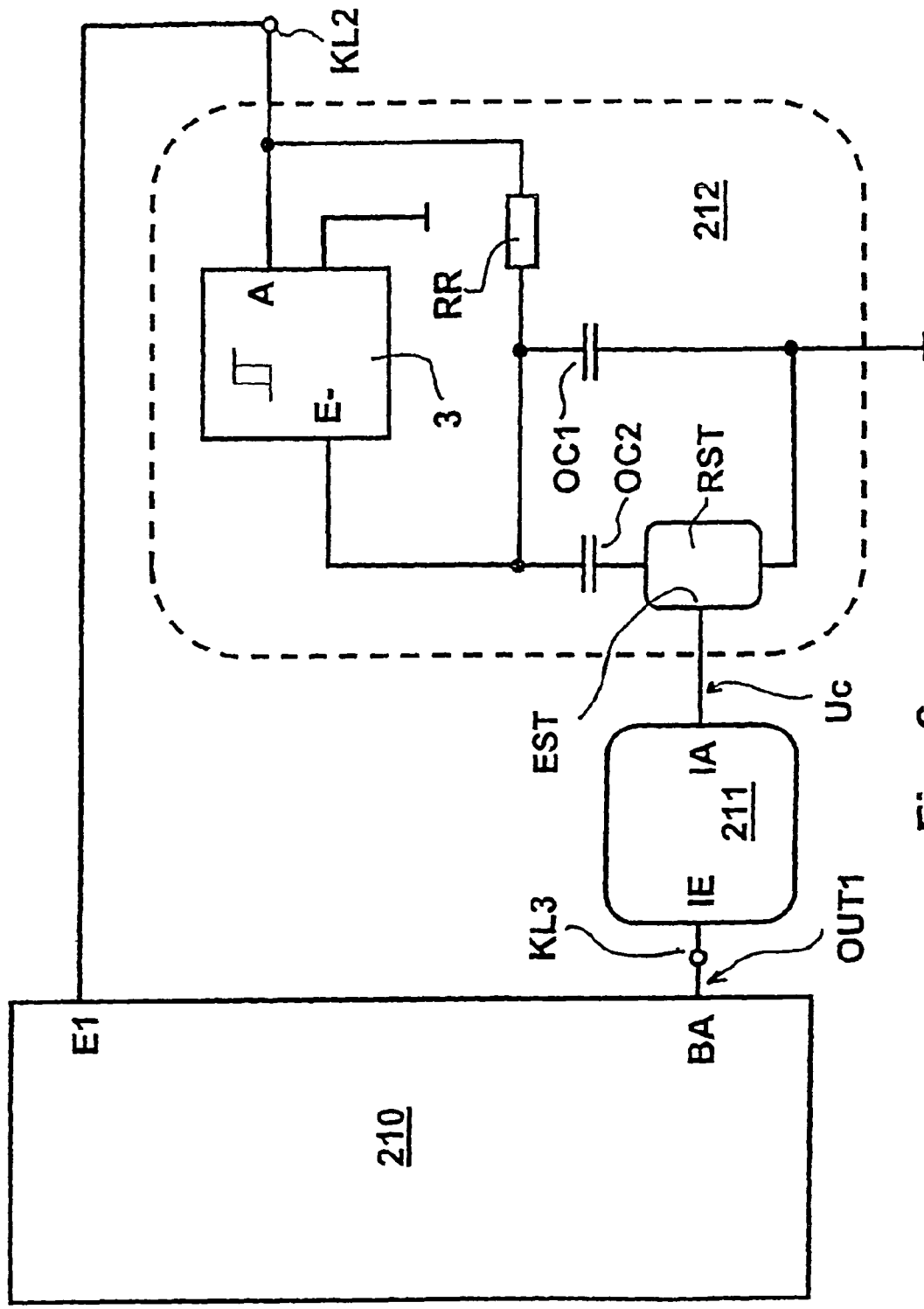

As another example of an oscillator circuit according to the invention, FIG. 6 shows the oscillator 212 and the integrator 211 of FIG. 2 together with the trigger circuit 210 already mentioned above with reference to FIG. 2 but not shown there, said trigger circuit 210 being a computer means, e.g. a microcontroller 210, in the example of FIG. 6. It has an input E1 connected to the output A of the Schmitt trigger 3 and, via the input E1, it is capable of detecting the VCO frequency, that is to say, the frequency of the oscillator 212, either continuously or at predefinable time intervals and of comparing it to a predefinable target frequency $f_{targ}$, and of delivering the output signal OUT1, consisting of a time sequence of the voltage values U1, U2, via the trigger output BA, thereby triggering the integrator 211 in such a way that the VCO frequency decreases if it is greater than the target frequency, and it increases if it is smaller than the target frequency, so that the oscillator 212 in the example of FIG. 6 is regulated.

This means that if the VCO frequency is greater than the target frequency $f_{targ}$, then the trigger signal OUT1 is set by the trigger circuit 210 in such a way that the VCO frequency decreases and, if the VCO frequency is smaller than the target frequency $f_{targ}$, then the trigger signal OUT1 is set by the trigger circuit 210 in such a way that the VCO frequency increases.

According to another variant, the trigger signal OUT1 and thus the VCO frequency are changed here in that, as a function of the deviation between the VCO frequency and the target frequency, either the first or the second voltage value U1, U2 is applied to the integrator input IE of the integrator 211.

According to another variant, the control voltage (Uc), thus the value of the control resistor RST and thus also the frequency f of the oscillator 212 is regulated via a modulated 1-bit signal, especially via a pulse width modulation, as a function of the deviation between the VCO frequency and the target frequency.

For example, the regulation can be carried out in that the trigger circuit 210 emits a trigger signal OUT1 which, in rapid succession, alternates between the first and second voltage values U1, U2, so that the trigger signal OUT1 is a 1-bit signal consisting of pulses during which the trigger signal OUT1 assumes the value U2, whereas it assumes the value U1 between the pulses.

For the regulation according to the invention, the pulse-duty factor is changed: by lengthening these pulses and/or by shortening the time intervals between these pulses, the mean value of the trigger signal OUT1 and thus also the control voltage Uc are raised; conversely, by shortening these pulses and/or by lengthening the time intervals between these pulses, the mean value of the trigger signal OUT1 and thus also the control voltage Uc are lowered.

According to the invention, in this manner, the trigger circuit 210 sets the pulse-duty factor and thus the mean value of the trigger signal OUT1 in such a way that the frequency f increases when it is smaller than the target frequency and decreases when it is greater than the target frequency, that is to say, the regulation is effectuated via a pulse width modulation of the 1-bit signal OUT1.

According to an alternative method, the rate of change of the control voltage Uc is influenced within a broad range by changing the amount of the difference OUT1–Uo (see, for example, FIG. 7), for instance, in such a way that Uc changes quickly when switched on and after a reset, whereas it changes slowly during normal operation or during the corrected state.

Advantageously, in this case, only the transmission of the trigger signal OUT1 is necessary between the trigger circuit 210 and the integrator 211, that is to say, the oscillator 212 is controlled exclusively by the time sequence of the first and second voltage values U1, U2, for which purpose one single line is sufficient and no recognition of data words etc. is necessary.

According to another variant, not shown in FIG. 6, the trigger circuit has another input E2 which will be discussed in conjunction with FIG. 7.

The circuit of FIG. 6 is especially well-suited for generating the excitation voltage for the ultrasonic transducer of an ultrasonic distance-measuring system, whereby, according to an especially advantageous embodiment of the invention, the decay frequency of the ultrasonic transducer is used as the target frequency. In this case, the oscillator frequency is automatically corrected to all time changes of the decay frequency and thus advantageously to every drift of the self-resonant frequency of the ultrasonic transducer.

A few application possibilities of the invention:
microcontroller-controlled frequency generation for operating ultrasonic transducers preferably at their resonant frequency,
temperature compensation of the drift of the self-resonance of the transducer,
replacement of the conventional oscillator circuit with potentiometer compensation at comparable costs.

In order to elucidate an embodiment of the invention, FIG. 7 shows a modification of the circuit of FIG. 6 in the form of a schematic block diagram. This circuit can also be a component of an ultrasonic distance-measuring system. The figure shows a microcontroller 210' as the trigger circuit that replaces the trigger circuit 210 of FIG. 6, the oscillator 212 and the terminal KL2 of FIG. 6 as well as an integrator 211' that replaces the integrator 211 of FIG. 6 and that has an inverting input IE– as well as a non-inverting input IE+. A voltage U0 is applied to the non-inverting input IE+, which will be discussed in greater detail below.

Figure 8:
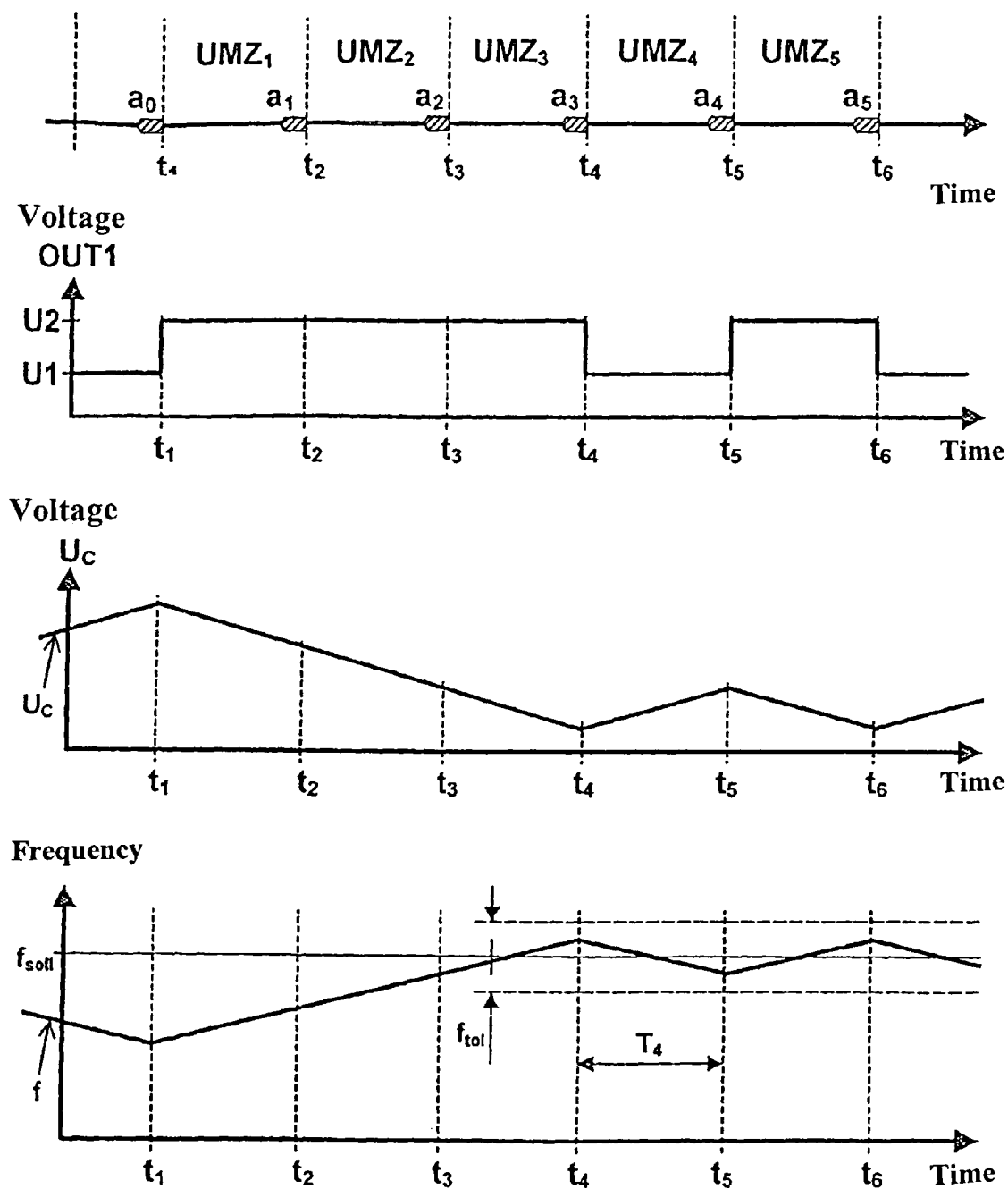

FIG. 8 shows an example of the correction of a frequency deviation using the circuit of FIG. 7 during the ultrasonic measuring cycles $UMZ_1$ to $UMZ_3$ of an ultrasonic distance-measuring system (not shown here), in which the circuit of FIG. 7 is used and serves to generate the excitation voltage for a sonic transducer (likewise not shown here) or a voltage that is proportional thereto. Examples are shown for the time sequence of five consecutive measuring cycles $UMZ_1$ to $UMZ_5$ and for the time sequence of the trigger signal OUT1, of the control voltage Uc as well as of the oscillator frequency f over the course of five measuring cycles $UMZ_1$ to $UMZ_5$. The time axes of all of the depictions in FIG. 8 match each other.

The integrator 211' is an inverting integrator for the signal OUT1 emitted by the trigger output BA' since, in the example of FIG. 7, this signal is applied to the inverting input IE− of the integrator 211'. In the example of FIG. 7, the oscillator 212 is one whose frequency decreases as the control voltage Uc rises. The integrator 211', while integrating the trigger signal OUT1, generates the control voltage Uc and applies it to the control input EST of the oscillator 212 or of the control resistor RST (in this context, also see FIGS. 2 to 5).

The microcontroller 210' has an input E1' connected to the output of the oscillator 212 and is capable of detecting the frequency of the oscillator 212 via the input E1' at predefinable time intervals for a specific detecting period and of applying the trigger signal OUT1 to the integrator input IE− of the integrator 211' via the trigger output BA'. The detecting periods are designated in FIG. 8 with the reference numerals $a_0, a_1, a_2, a_3, a_4$ and $a_5$; in the example of FIG. 8, they are each near the end of a measuring cycle.

If the oscillator frequency f is greater than a predefinable target frequency $f_{targ}$ at the point in time when it is detected, then the microcontroller 210' applies the first control voltage U1 to the inverting input IE− of the integrator 211' via the trigger output BA', as a result of which the control voltage Uc is raised and thus the frequency f of the oscillator 212 is decreased. If the oscillator frequency f is smaller than the target frequency $f_{targ}$ at the point in time when it is detected, then the microcontroller 210' applies the second control voltage U2 to the inverting input IE− of the integrator 211' via the trigger output BA', as a result of which the control voltage Uc is decreased and thus the frequency f of the oscillator 212 is increased, so that the oscillator 212 is also a regulated oscillator in the example of FIG. 7.

The reference voltage Uo applied to the non-inverting input IE+ of the integrator 211' is such that it is equal to the arithmetic mean value from the first and second voltage values U1, U2, and it serves to symmetrize the time behavior of the integrator 211' when the first voltage value U1 is applied vis-à-vis its time behavior when the second voltage value U2 is applied.

The microcontroller 210' having the input E1', which at times functions as a frequency counter using its built-in hardware timer and/or suitable software and having at least the binary output BA', controls the propagation time measurement as well as the generation of the frequency f. Moreover, the invention comprises the use of the integrator 211' and of the oscillator 212 whose frequency is controlled with a current or a voltage, referred to below as a VCO. Special embodiments and combinations of the integrator 211' and of the VCO 212 constitute integral parts of the invention.

In a typical ultrasonic measuring system according to the ultrasonic propagation time method, the measurement is carried out cyclically. Here, at the beginning of each cycle, an ultrasonic sine beat is emitted and, at the same time, a timer is started which measures the time until the receipt of the echo that is reflected from the object to be detected. At the end of each measuring cycle $UMZ_i$ (that is to say, at the end of each of the measuring cycles $UMZ_1, UMZ_2, UMZ_3, UMZ_4, UMZ_5$), the propagation time measurement is interrupted (timeout). Thus, at the end of each cycle, the timer circuit of the microcontroller 210' is available for other tasks.

According to the invention, the microcontroller 210' measures the frequency of the VCO 212 preferably once at any point in time during each cycle $UMZ_i$ but preferably at the end of the cycle, during a detecting period $a_i$, (namely, for example, during the detecting periods $a_0$ to $a_5$) and compares it to a target value $f_{targ}$.

The target frequency can be expressed, for example, as a multiple of the clock frequency of the microcontroller 210'. The clock frequency $f_N$ of the microcontroller 210' serves as the frequency normal. A quartz clock generator T (FIG. 7), for example, serves as the clock generator for this clock frequency. On the basis of the comparison operation, the binary output BA' of the microcontroller 210' is set or reset, so that either the value U2 or the value U1 is taken for the trigger signal OUT1 emitted by the binary output BA'.

The integrator 211' having an integration time constant $\tau \gg T_i(UMZ_i)$ generates an oscillator control voltage Uc from this 1-bit pulse sequence and this oscillator control voltage Uc determines the frequency of the VCO 212. This closed-loop control circuit sets the frequency f of the VCO 212 in such a way that, after a time $nT_i$, a change of $f_{targ}$ is corrected and so that then f oscillates by the target frequency $f_{targ}$ within a tolerance band $f_{tol}$, whereby n is a positive integer.

For this purpose, the cycle time T1 does not have to be constant; it merely has to be ensured that $T_i < T_{max}$ is not exceeded. A brief interruption of the closed-loop control circuit due to a disturbance (EMI) causes this value to leave the tolerance band, whereby the magnitude of the error is proportional to the interruption time. Therefore, brief interruptions only cause a slight loss of performance, as a result of which the system is error-tolerant.

In the present example (FIG. 8), the tolerance band $f_{tol}$ is reached and maintained beyond $UMZ_3$. For this purpose, the integration time constant has to be dimensioned in such a way that the following applies:

$$\Delta f_i(T_i) < f_{tol}/2.$$

VCO: conventional VCO-ICs use voltage-controlled sources of current, which determine the charging current of the timing-C and thus the frequency of the oscillator circuit. Owing to the effort involved, this principle can only be feasibly realized as an IC. Another possibility consists of using a Schmitt trigger that is back-coupled via an integrator, whereby its hysteresis and thus the charging time of the timing-C and consequently the frequency are influenced by the control voltage. An example of such an IC is the timer ICx555. If its control input is used for frequency detuning, a frequency shift likewise brings about an undesired change in the pulse-duty factor. Moreover, with a VCO of this type in conventional circuit technology, the frequency-determining RC time constant of the VCO can be detuned in that an electronically controllable resistor is used as the frequency-determining resistor. The triggering of this resistor is then difficult, since it is operated in a "floating" manner.

Integrator: as a matter of principle, all known solutions from general circuit technology can be used as the integrator according to FIG. 7. In the following embodiments of the invention, two types of integrators are used:

1. The RC integration member, referred to below as Type A, because of its simplicity and its property of directly forming the direct current mean value of an alternating voltage for $\tau \gg 1/f$.
2. The active inverting integrator having a differential input, referred to below as Type B. With this type, the reference voltage $U_0$ is supplied to the non-inverting input. In order to achieve the same magnitude for the rise in the output voltage of the integrator but with the opposite sign for both states U2, U1 or Hi, Lo of OUT1, the following must apply:

$$U0 = \{OUT1(Hi) - OUT1(Lo)\}/2.$$

Here, Hi=high signal, for example, U2, and Lo=low signal, for example, U1.

Figure 2:
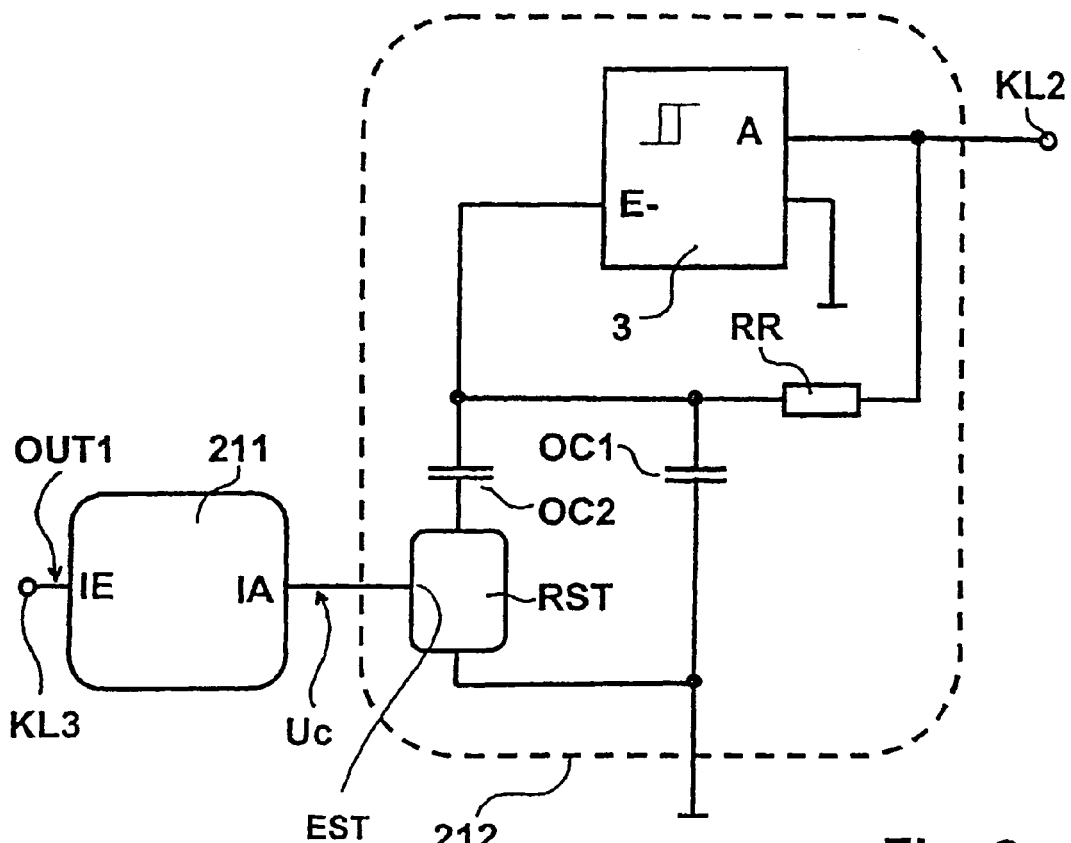

The operating principle of the circuit of FIG. 1 is essentially the same as that of the oscillator 212 of FIG. 2.

Other Variants of the Invention:

FIG. 9:

Integrator type A according to FIG. 7 (reference numeral 211') consisting of R1 and C1, $R_{var}$ according to FIG. 1 consisting of the N-channel JFET T1. +U is any desired auxiliary voltage, for example, the operating voltage of the microcontroller 210' of FIG. 7. Condition: +U>|Up|, whereby Up is the pinch-off voltage of the JFET.

Analogously, P-channel FETs can be used for T1, then the source has to be connected to the GND rather than to +U.

Advantage: minimum resources required.

Figure 3:
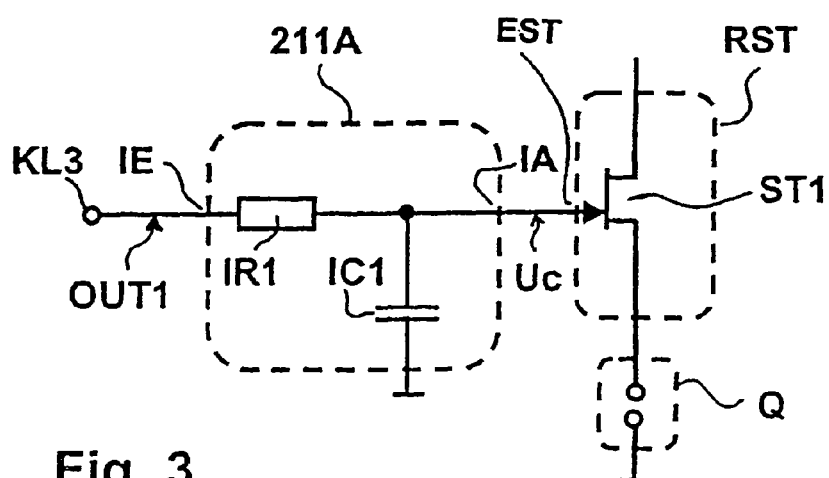

The operating principle of the circuit of FIG. 9 is essentially the same as that of the integrator 211A and of the control resistor RST of FIG. 3.

FIG. 10:
  integrator type A consisting of R1 and C1
  source of current consisting of T1 and R2 converts the control voltage Uc into the current Ic
  $R_{var}$: T2

Figure 4:
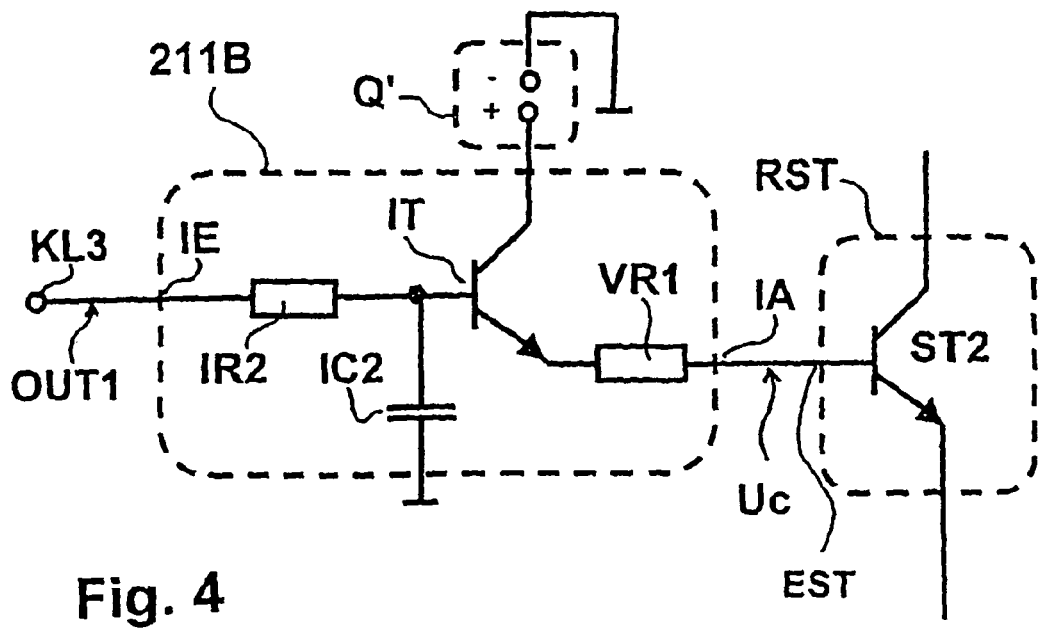

The operating principle of the circuit of FIG. 10 is essentially the same as that of the integrator 211B and of the control resistor RST of FIG. 4.

FIG. 11:
  integrator type B consisting of R1, R2, R3, C1 and T1.
  The emitter of T1 forms the non-inverting input. U0 corresponds to the threshold voltage UBE of T1. The voltage divider R1, R2 provides equal values for the rising and falling slopes of Uc.
  Integration time constant: $\tau = (R1 \| R2)C1$
  R4 converts the control voltage Uc into the current Ic
  $R_{var}$: T2

Advantage: linear control characteristic, therefore almost constant steepness df/dt over the entire control range.

Figure 5:
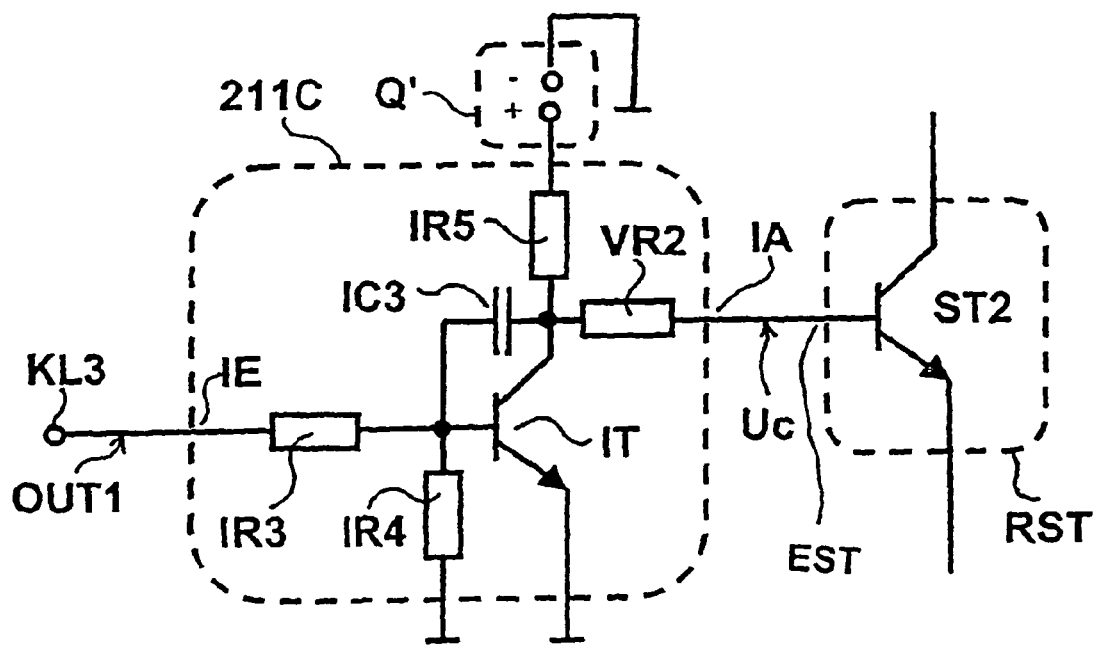

The operating principle of the circuit of FIG. 11 is essentially the same as that of the integrator 211c and of the control resistor RST of FIG. 5.

FIG. 12 (with Reference to FIG. 7 and FIG. 8):

FIG. 12 schematically shows a trigger circuit 310 that allows an influencing of the integration time, for example, of the integrator 211' of FIG. 7 by means of structural elements that are upstream from said integrator 211'.

According to a preferred embodiment of the invention, a trigger circuit 310 according to FIG. 12 serves as the trigger circuit and it has a computer means EDVE configured as a microcontroller μC and having the following components:
  a first binary connection M that emits a first binary signal OUTA and that is connected to the trigger output AUS2 via a first feed line Z1 in which a first intermediate resistor RZ1 is interconnected,
  a second binary connection AB that emits a second binary signal OUTB and that is connected to the trigger output AUS2 via a second feed line Z2 in which a first diode D1 and a second intermediate resistor RZ2 series-connected downstream from said first diode are interconnected, whereby the second intermediate resistor RZ2 has a smaller value than the first intermediate resistor RZ1, and the anode of the first diode D1 is connected to the second binary connection AB and the cathode of the first diode D1 is connected to the second intermediate resistor RZ2,
  a third binary connection AC that emits a third binary signal OUTC and that is connected to a third feed line Z3 that branches off from the second feed line Z2 between the first diode D1 and the second intermediate resistor and in which a second diode D2 is interconnected whose cathode is connected to the third binary connection AC and whose anode is connected to the cathode of the first diode D1,
whereby
a) the first, second and third binary signals OUTA, OUTB, OUTC are each a high-signal or a low-signal or a time sequence of such signals, b) the first binary connection AA emits a high-signal if the frequency of the oscillator 112, 212 is smaller than the target frequency, and otherwise, it emits a low-signal, or vice versa, and c) the trigger circuit 310
  can be set into a first mode, fast mode, in which the second and the third binary connections AB, AC
    each emit a high-signal when the first binary connection AA emits a high-signal,
    and each emit a low-signal when the first binary connection AA emits a low-signal,
  so that the integrator 211, 211', 211A, 211B, 211C (not shown in FIG. 2) is capable of integrating the trigger signal OUT1 having a first time constant, into the control voltage,
  and can be set into a second mode, slow mode, in which the second binary connection AB always emits a low-signal and the third binary connection AC always emits a high-signal, so that the integrator 211, 211', 211A, 211B, 211C is capable of integrating the trigger signal OUT1 having a second time constant, which is greater than the first time constant, into the control voltage Uc.

The following table shows the interaction of the binary signals OUTA, OUTB and OUTC that occurs according to this variant, depending on whether the trigger circuit is in the fast or slow mode:

TABLE 6'

| first binary signal OUTA | second binary signal OUTB | third binary signal OUTC | mode |
|---|---|---|---|
| high | high | high | fast |
| low | low | low | fast |
| high | low | high | slow |
| low | low | high | slow |

The trigger circuit is thus in the fast mode when the second and third binary signals are both high signals or both low signals, and in the slow mode when the second binary signal is a low signal and the third binary signal is a high signal, whereby the off-load voltage at the output AUS2 corresponds to the voltage level of the binary output AA.

The second time constant can be smaller, for example, by a factor x, than the first time constant; in a first approximation, this can be achieved in that the second intermediate resistor RZ2 is selected smaller by the factor x than the first intermediate resistor RZ1.

Since the integration time constant needed to achieve the required frequency resolution lies in the range of a few seconds, a time constant switch-over, for example, from τ to τ/x is advantageous in order to allow a fast introduction of the frequency f into the vicinity of $f_{targ}$ after the μC has been switched on and after each reset of the μC. In the initialization phase, the μC program can run through a loop in which exclusively frequency measurements are carried out with a shortened measuring time $a_t/x$ and a frequency resolution reduced by the factor x, for example, until f reaches the vicinity of $f_{targ} \pm x \ast f_{tot}/2$. Then the shorter time constant τ/x is deactivated and the normal measuring cycles $UMZ_i$ begin.

Since the residual currents of the ports of microcontrollers are in the range from 0.1 μA to 10 μA and would thus impermissibly influence the integration time, the binary output AB with a low-residual-current diode D1 is uncoupled. In order to be able to carry out the fast integration in both directions, another binary output AC with a diode D2 can be used. Then, for example, a logical control according to the table of FIG. 21 is to be used.

The trigger circuit 310 of FIG. 12 can be used advantageously instead of the trigger circuits 210 of FIG. 6 and 210' of FIG. 7; in these cases, the trigger circuit 310 requires corresponding inputs and/or outputs that, in terms of their function, correspond to those of the trigger circuits 210 and 210' (not shown in FIG. 12). If the integrator connected to the trigger circuit 310 of FIG. 12 is an integrator according to FIG. 3, 4 or 5 (reference numerals 211A, 211B, 211C), then the integrator resistors IR1 or IR2 or IR3 can be dispensed with.

The signal OUT1 emitted by the trigger circuit 310 is a time sequence of the voltage values U1, U2.

INDUSTRIAL APPLICABILITY

The invention is industrially applicable particularly, for example, in the realm of radio technology, audio technology and ultrasonic distance measurement that is based on the principle of echo-sounding measurement.

List of reference numerals

| | |
|---|---|
| 3 | Schmitt trigger |
| 112, 212 | oscillators |
| 210, 210', 310 | trigger circuits |
| 211, 211' | integrators |
| 211A, 211B, 211C | embodiments for 211 |
| $a_0, a_1, a_2, a_3, a_4, a_5, a_i$ | detecting periods |
| AA, AB, AC | binary connections |
| AUS2, BA, BA' | trigger outputs |
| E1, E1' | inputs of 210, 210' |
| E− | inverting input of von 3 |
| EDVE | computer means in the trigger circuit 310 |
| EST | control input of the control resistor RST |
| f | oscillator frequency |
| $f_{targ}$ | target frequency |
| $f_{tol}$ | tolerance band |
| IE, IA | integrator input, integrator output |
| IE+, IE− | non-inverting, inverting integrator input |
| IC1, IC2, IC3 | integrator capacitors |
| IR1-IR5 | integrator resistors |
| IT | integrator transistor |
| KL3 | terminal |
| OC1, OC2 | oscillator capacitors |
| OUTA, OUTB, OUTC | binary signals |
| OUT1 | trigger signal |
| Q, Q' | voltage source, additional voltage source |
| Q" | third potential |
| RR | feedback resistor |
| Rvar, RST | control resistors |
| ST1, ST2 | embodiments for RST |
| RZ1, RZ2 | first, second intermediate resistors |
| ST1, ST2, ST3, ST4 | control transistors |
| T | clock generator |
| Uo | reference voltage |
| U1, U2 | first, second voltage values |
| Uc | control voltage |
| $UMZ_1$-$UMZ_5$, $UMZ_i$ | measuring cycles |
| VR1, VR2 | series resistors |

The invention claimed is:

1. An oscillator circuit with an oscillator (112, 212) comprising a toggle circuit (3), a Schmitt trigger (3) or a multivibrator or a relaxation oscillator or an amplifier circuit with hysteresis behavior, having an output (A) and an inverting input (E−), whereby
the output (A) is connected to the inverting input (E−) via a feedback resistor (RR),
the inverting input (E−) is connected to a first potential via a first oscillator capacitor (OC1),
the inverting input (E−) is also connected to a second potential via a second oscillator capacitor (OC2) and via a control resistor ($R_{var}$, RST, ST1, ST2, ST3, ST4) that is series-connected to said second oscillator capacitor, and whose value can be adjusted or electrically controlled,
so that a frequency (f) of the oscillator (112, 212) can be varied by changing the value of the control resistor ($R_{var}$, RST, ST1, ST2, ST3, ST4),
wherein the control resistor ($R_{var}$, RST) is made up of a collector-emitter channel or a drain-source channel of a control transistor (ST3, ST4), at whose emitter or source a control voltage (Uc) has been applied and whose base or gate is connected to a third potential (Q"), so that
the second oscillator capacitor (OC2) is connected to the control voltage (Uc) via the collector-emitter channel or the drain-source channel of the control transistor, and thus the control transistor is connected as a common base or common gate,
and the frequency (f) of the oscillator (112, 212) can be varied by changing the control voltage (Uc).

2. The oscillator circuit according to claim 1, characterized in that
the control resistor (ST1) is connected to the second potential via an interconnected voltage source (Q), and/or
the first oscillator capacitor (OC1) is connected to the first potential via an interconnected voltage source.

3. The oscillator circuit according to claim 1, characterized in that
the control resistor is formed by the collector-emitter channel of the control transistor, through whose base a control current flows, so that
the second oscillator capacitor is connected to the second potential, especially to ground, via the collector-emitter channel of the control transistor,
and the frequency of the oscillator can be varied by changing the control current.

4. The oscillator circuit according to claim 1, characterized in that
a value of the control resistor ($R_{var}$, RST, ST1, ST2, ST3, ST4) and thus the frequency of the oscillator (112, 212) can be influenced, controlled or regulated via a modulated 1-bit signal, especially via a pulse width modulation.

5. The oscillator circuit according to claim 1, characterized in that
the first and the second potentials are identical to each other.

6. The oscillator circuit according to claim 5, characterized in that
the first and the second potentials are both identical to ground potential.

7. An oscillator circuit with an oscillator (112, 212) comprising a toggle circuit (3), a Schmitt trigger (3) or a multivibrator or a relaxation oscillator or an amplifier circuit with hysteresis behavior, having an output (A) and an inverting input (E−), whereby
the output (A) is connected to the inverting input (E−) via a feedback resistor (RR),
the inverting input (E−) is connected to a first potential via a first oscillator capacitor (OC1),
the inverting input (E−) is also connected to a second potential via a second oscillator capacitor (0C2) and via a control resistor ($R_{var}$, RST, ST1, ST2, ST3, ST4) that is series-connected to said second oscillator capacitor, and whose value can be adjusted or electrically controlled, so that a frequency (f) of the oscillator (112, 212) can be varied by changing the value of the control resistor ($R_{var}$, RST, ST1, ST2, ST3, ST4), wherein the control resistor ($R_{var}$, RST) is made up of a collector-emitter channel or a drain-source channel of a control transistor (ST3, ST4), at whose emitter or source a control voltage (Uc) has been applied and whose base or gate is connected to a third potential (Q″), so that the second oscillator capacitor (OC2) is connected to the second potential, especially to ground, via the collector-emitter channel or via the drain-source channel of the control transistor (ST1, ST2).

8. The oscillator circuit according to claim 7, characterized in that an emitter or a source of the control transistor (ST1, ST2) is connected to the second oscillator capacitor (OC2) and wherein a collector or a drain of the control transistor (ST1, ST2) is connected to the second potential (Q2).

9. An oscillator circuit characterized in that an oscillator circuit with an oscillator (112, 212) comprising a toggle circuit (3), a Schmitt trigger (3) or a multivibrator or a relaxation oscillator or an amplifier circuit with hysteresis behavior, having an output (A) and an inverting input (E−), whereby the output (A) is connected to the inverting input (E−) via a feedback resistor (RR), the inverting input (E−) is connected to a first potential via a first oscillator capacitor (OC1), the inverting input (E−) is also connected to a second potential via a second oscillator capacitor (OC2) and via a control resistor ($R_{ear}$, RST, ST1, ST2, ST3, ST4) that is series-connected to said second oscillator capacitor, and whose value can be adjusted or electrically controlled, so that a frequency (f) of the oscillator (112, 212) can be varied by changing the value of the control resistor ($R_{var}$, RST, ST1, ST2, ST3, ST4), the control resistor ($R_{var}$, RST) is made up of a collector-emitter channel or a drain-source channel of a control transistor (ST1, ST2), at whose base or gate a control voltage (Uc) has been applied, so that the second oscillator capacitor (OC2) is connected to the second potential, especially to ground, via the collector-emitter channel or via the drain-source channel of the control transistor (ST1, ST2), and the frequency (f) of the oscillator (112, 212) can be varied by changing the control voltage (Uc), wherein the base or gate of the control transistor (ST1, ST2) is connected to the output (IA) of an integrator (211, 211′, 211A, 211B, 211C) whose input (IE, IE+, IE−) is connected to a trigger output (AUS2, BA, BA′) of a trigger circuit (210, 210′, 310), whereby the trigger circuit (210, 210′, 310) is capable of delivering a trigger signal (OUT1) to the input (IE, IE+, IE−) of the integrator (211, 211′, 211A, 211B, 211C) via the trigger output (AUS2, BA, BA′), said trigger signal being either equal to or smaller than a first voltage value (U1) or equal to or greater than a second voltage value (U2), whereby the first voltage value (U1) is smaller than the second voltage value (U2), and the integrator (211, 211′, 211A, 211B, 211C) is capable of integrating the trigger signal (OUT1) into the control voltage (Uc) and of delivering it via the output (IA) of the integrator (211, 211′, 211A, 211B, 211C) to the base or gate of the control transistor (ST1, ST2), so that either the control voltage (Uc) drops if the trigger signal (OUT1) is equal to or smaller than the first voltage value (U1), and then the control voltage (Uc) rises if the trigger signal (OUT1) is equal to or greater than the second voltage value (U2), or vice versa, and thus the frequency (0 of the oscillator (112, 212) or its rate of change can be influenced or controlled by the trigger signal (OUT1).

10. The oscillator circuit according to claim 9, characterized in that the control voltage (Uc) and thus the frequency (f) of the oscillator (112, 212) can be influenced, controlled or regulated via a modulated 1-bit signal, especially via a pulse width modulation.

11. The oscillator circuit according to claim 9, characterized in that the trigger circuit (210, 210′, 310) has an input (E1, E1′) that is connected to the output (A) of the toggle circuit or of the Schmitt trigger (3), and said trigger circuit is capable of detecting the frequency (f) of the oscillator (112, 212) via the input (E1, E1′) and of influencing it by means of the trigger signal (OUT1) in such a way that the frequency (f) of the oscillator (112, 212) decreases if it is greater than a predefinable target frequency ($f_{targ}$) and it increases if it is smaller than the target frequency ($f_{targ}$), so that the oscillator (112, 212) is a regulated oscillator.

12. The oscillator circuit according to claim 11 characterized in that the trigger circuit (210, 210′, 310) is capable of changing the time sequence of the first and second voltage values (U1, U2) in such a way that the frequency of the oscillator (112, 212) decreases if the frequency of the oscillator (112, 212) is greater than the predefinable target frequency ($f_{targ}$), and the frequency of the oscillator (112, 212) increases if the frequency of the oscillator (112, 212) is smaller than the predefinable target frequency ($f_{targ}$), so that the oscillator (112, 212) is an oscillator that is regulated via a pulse modulation.

13. The oscillator circuit according to claim 11, characterized in that the trigger circuit (310) has a computer means (EDVE) comprising the following components:

a first binary connection (AA) that emits a first binary signal (OUTA) and that is connected to the trigger output (AUS2) via a first feed line (Z1) in which a first intermediate resistor (RZ1) is interconnected, a second binary connection (AB) that emits a second binary signal (OUTB) and that is connected to the trigger output (AUS2) via a second feed line (Z2) in which a first diode (D1) and a second intermediate resistor (RZ2) series-connected downstream from said first diode are interconnected, whereby the second intermediate resistor (RZ2) has a smaller value than the first intermediate resistor (RZ1), and an anode of the first diode (D1) is connected to the second binary connection (AB) and a cathode of the first diode (D1) is connected to the second intermediate resistor (RZ2), a third binary connection (AC) that emits a third binary signal (OUTC) and that is connected to a third feed line (Z3) that branches off from the second feed line (Z2) between the first diode (D1) and the second intermediate resistor and in which feed line a second diode (D2) is interconnected whose cathode is connected to the third binary connection (AC) and whose anode is connected to the cathode of the first diode (D1), whereby
a) the first, second and third binary signals (OUTA, OUTB, OUTC) are each a high-signal or a low-signal or a time sequence of such signals,
b) the first binary connection (AA) emits a high-signal if the frequency (0 of the oscillator (112, 212) is smaller than the target frequency, and otherwise, it emits a low-signal, or vice versa, and
c) the trigger circuit (310)
can be set into a first mode, fast mode, in which the second and the third binary connections (AB, AC) each emit a high-signal when the first binary connection (AA) emits a high-signal,
and each emit a low-signal when the first binary connection (AA) emits a low-signal,
so that the integrator (211, 211', 211A, 211B, 211C) is capable of integrating the trigger signal (OUT1) having a first time constant, into the control voltage (Uc),
and can be set into a second mode, slow mode, in which the second binary connection (AB) always emits a low-signal and the third binary connection (AC) always emits a high-signal, so that the integrator (211, 211', 211A, 211B, 211C) is capable of integrating the trigger signal (OUT1) having a second time constant that is greater than the first time constant, into the control voltage (Uc).

14. The oscillator circuit according to claim 13, characterized in that,
after the trigger circuit (310) has been switched on or reset, it is capable of first autonomously setting itself into the fast mode and
after a certain period of time
or if the frequency of the oscillator (112, 212) has fallen below a predefined distance from the target frequency,
or if the frequency of the oscillator (112, 212) has reached a predefined frequency range,
of setting itself into the slow mode.

15. The oscillator circuit according to claim 9, characterized in that
the integrator (211, 211', 211A, 211B, 211C) is a non-inverting integrator (211A, 211B, 211C) that additionally has an inverting integrator input to which a reference voltage (Uo) is applied,
or it is an inverting integrator (211') that additionally has a non-inverting integrator input to which a reference voltage (Uo) is applied.

16. The oscillator circuit according to claim 15, characterized in that
the reference voltage (Uo) is equal to an arithmetic mean value from the first and second voltage values (U1, U2).

17. The oscillator circuit according to claim 11, characterized in that
the trigger circuit (210) has another input (E2) and, via this input, it is capable of detecting the frequency of an alternating voltage, especially a decay frequency of an ultrasonic transducer (16), and of taking it as the target frequency ($f_{targ}$).

18. An oscillator circuit characterized in that
an oscillator circuit with an oscillator (112, 212) comprising a toggle circuit (3), a Schmitt trigger (3) or a multi-vibrator or a relaxation oscillator or an amplifier circuit with hysteresis behavior, having an output (A) and an inverting input (E−), whereby the output (A) is connected to the inverting input (E−) via a feedback resistor (RR),
the inverting input (E−) is connected to a first potential via a first oscillator capacitor (OC1),
the inverting input (E−) is also connected to a second potential via a second oscillator capacitor (OC2) and via a control resistor ($R_{var}$, RST, ST1, ST2, ST3, ST4) that is series-connected to said second oscillator capacitor, and
whose value can be adjusted or electrically controlled, so that a frequency (f) of the oscillator (112, 212) can be varied by changing the value of the control resistor ($R_{var}$, RST, ST1, ST2, ST3, ST4), the control resistor ($R_{var}$, RST) is made up of a collector-emitter channel or a drain-source channel of a control transistor (ST1, ST2), at whose base or gate a control voltage (Uc) has been applied, so that
the second oscillator capacitor (0C2) is connected to the second potential, especially to ground, via the collector-emitter channel or via the drain-source channel of the control transistor (ST1, ST2),
and the frequency (f) of the oscillator (112, 212) can be varied by changing the control voltage (Uc),
wherein
the base or gate of the control transistor (ST1, ST2) is connected to the output (IA) of an integrator (211, 211', 211A, 211B, 211C) whose input (IE, IE+, IE−) is connected to a trigger output (AUS2, BA, BA') of a trigger circuit (210, 210', 310),
wherein the trigger circuit (210, 210', 310) is capable of delivering a trigger signal (OUT1) to the input (IE, IE+, IE−) of the integrator (211, 211', 211A, 211B, 211C) via the trigger output (AUS2, BA, BA'), said trigger signal being either equal to or smaller than a first voltage value (U1) or equal to or greater than a second voltage value (U2), whereby the first voltage value (U1) is smaller than the second voltage value (U2),
wherein the trigger signal (OUT1) is a pulse-modulated 1-bit signal that alternates essentially like a square wave between the first and second voltage values (U1, U2), so that
either the control voltage (Uc) can be lowered in that a mean value of the trigger signal (OUT1) is decreased by correspondingly changing a time sequence of the first and second voltage values (U1, U2), and the control voltage (Uc) can be raised in that the mean value of the trigger signal (OUT1) is increased by correspondingly changing the time sequence of the first and second voltage values (U1, U2),
or vice versa,
and thus the frequency (f) of the oscillator (112, 212) or its rate of change can be influenced or controlled via the pulse-modulated 1-bit signal.

19. The oscillator circuit according to claim 18, characterized in that
the trigger signal (OUT1) is a pulse-modulated 1-bit signal that alternates essentially like a square wave with a variable pulse-duty factor between the first and second voltage values (U1, U2), whereby the mean value of said signal can be varied by correspondingly changing the pulse-duty factor, so that the pulse-modulated 1-bit signal for influencing or controlling the frequency (f) or its rate of change is a pulse-width-modulated signal.

20. A method to influence, control or regulate a frequency of an oscillator (112, 212), whereby
the oscillator (112, 212) employed is one that comprises a toggle circuit (3), a Schmitt trigger (3) or a multi-vibrator or a relaxation oscillator or an amplifier circuit with hysteresis behavior, having an output (A) and an inverting input (E−), the output (A) is connected to the inverting input (E−) via a feedback resistor (RR), the inverting input (E−) is connected to a first potential via a first oscillator capacitor (OC1), the inverting input (E−) is also connected to a second potential via a second oscillator capacitor (OC2) and via a control resistor ($R_{var}$, RST, ST1, ST2, ST3, ST4) that is series-connected to said second oscillator capacitor, and whose value can be adjusted or electrically controlled, and the frequency (f) of the oscillator (112, 212) is varied by changing the value of the control resistor ($R_{var}$, RST, ST1, ST2, ST3, ST4), wherein the control resistor ($R_{var}$, RST) is made up of a collector-emitter channel or a drain-source channel of a control transistor (ST3, ST4), at whose emitter or source a control voltage (Uc) is applied, and whose base or gate is connected to a third potential (Q″), so that the second oscillator capacitor (OC2) is connected to the second potential via the collector-emitter channel or the drain-source channel of the control transistor, and thus the control transistor is operated as a common base or common gate, and the frequency (f) of the oscillator (112, 212) is varied by changing the control voltage (Uc).

21. A method to influence, control or regulate a frequency of an oscillator (112, 212), whereby the oscillator (112, 212) employed is one that comprises a toggle circuit (3), a Schmitt trigger (3) or a multi-vibrator or a relaxation oscillator or an amplifier circuit with hysteresis behavior, having an output (A) and an inverting input (E−), the output (A) is connected to the inverting input (E−) via a feedback resistor (RR), the inverting input (E−) is connected to a first potential via a first oscillator capacitor (OC1), the inverting input (E−) is also connected to a second potential via a second oscillator capacitor (0C2) and via a control resistor ($R_{ya}$, RST, ST1, ST2, ST3, ST4) that is series-connected to said second oscillator capacitor, and whose value can be adjusted or electrically controlled, and the frequency (f) of the oscillator (112, 212) is varied by changing the value of the control resistor ($R_{var}$, RST, ST1, ST2, ST3, ST4), wherein a collector-emitter channel or a drain-source channel of a control transistor (ST1, ST2), is used as the control resistor ($R_{var}$, RST), so that the second oscillator capacitor (0C2) is connected to the second potential, especially to ground, via the collector-emitter channel or via the drain-source channel of the control transistor (ST1, ST2), a control voltage (Uc) is applied at the base or gate of the control transistor (ST1, ST2), and the frequency of the oscillator (112, 212) is varied by changing the control voltage (Uc) wherein the control resistor (ST1, ST2) employed is one whose base or gate is connected to the output (IA) of an integrator (211, 211′, 211A, 211B, 211C) whose input (IE, IE+, IE−) is connected to a trigger output (AUS2, BA, BA') of a trigger circuit (210, 210′, 310), whereby the trigger circuit (210, 210′, 310) employed is one that is capable of delivering a trigger signal (OUT1) to the input (IE, IE+, IE−) of the integrator (211, 211′, 211A, 211B, 211C) via the trigger output (AUS2, BA, BA'), said trigger signal being either equal to or smaller than a first voltage value (U1) or equal to or greater than a second voltage value (U2), whereby the first voltage value (U1) is smaller than the second voltage value (U2), and the integrator (211, 211′, 211A, 211B, 211C) employed is one that is capable of integrating the trigger signal (OUT1) into the control voltage (Uc) and of delivering it to the base or gate of the control transistor (ST1, ST2) via the output (IA) of the integrator (211, 211′, 211A, 211B, 211C), and whereby either the control voltage (Uc) can be lowered in that the trigger circuit (210, 210′, 310) is controlled in such a way that the trigger signal (OUT1) is equal to or smaller than the first voltage value (U1), and the control voltage (Uc) can be raised in that the trigger circuit (210, 210′, 310) is controlled in such a way that the trigger signal (OUT1) is equal to or greater than the second voltage value (U2), or vice versa, so that the frequency (0 of the oscillator (112, 212) or its rate of change is influenced or controlled by the trigger signal (OUT1).

22. The method according to claim 21, characterized in that the control resistor (ST1, ST2) employed is one that is connected to the second potential via an interconnected voltage source (Q), and/or the first oscillator (OC1) employed is one that is connected to the first potential via an interconnected voltage source.

23. The oscillator circuit according to claim 21, characterized in that the collector-emitter channel of the control transistor, through whose base a control current flows, is used as the control resistor, so that the second oscillator capacitor is connected to the second potential, especially to ground, via the collector-emitter channel of the control transistor, and the frequency of the oscillator is varied by changing the control current.

24. The method according to claim 21 characterized in that an emitter or a source of the control transistor (ST1, ST2) is connected to the second oscillator capacitor (OC2) and wherein a collector or a drain of the control transistor (ST1, ST2) is connected to the second potential (Q2).

25. The method according to claim 21, characterized in that a value of the control resistor ($R_{var}$, RST, ST1, ST2, ST3, ST4) and thus the frequency (f) of the oscillator (112, 212) are influenced, controlled or regulated via a modulated 1-bit signal, especially via a pulse width modulation.

26. The method according to claim 21, characterized in that the control voltage (Uc) and thus the frequency (f) of the oscillator (112, 212) are influenced, controlled or regulated via a modulated 1-bit signal, especially via a pulse width modulation.

27. The method according to claim 21, characterized in that as the integrator (211, 211′, 211A, 211B, 211C), a non-inverting integrator (211A, 211B, 211C) that additionally has an inverting integrator input to which a reference voltage (Uo) is applied is used, or an inverting integrator (211′) that additionally has a non-inverting integrator input to which a reference voltage (Uo) is applied is used.

28. The method according to claim 27, characterized in that the reference voltage
(Uo) that is applied to the additional integrator input is such that it is equal to an arithmetic mean value from the first and second voltage values (U1, U2).

29. The method according to claim 28, characterized in that the frequency of an alternating voltage, especially a decay frequency of an ultrasonic transducer (16), is used as the target frequency.

30. A method to influence, control or regulate a frequency of an oscillator (112, 212), whereby
the oscillator (112, 212) employed is one that comprises a toggle circuit (3), a Schmitt trigger (3) or a multi-vibrator or a relaxation oscillator or an amplifier circuit with hysteresis behavior, having an output (A) and an inverting input (E−),
the output (A) is connected to the inverting input (E−) via a feedback resistor (RR),
the inverting input (E−) is connected to a first potential via a first oscillator capacitor (OC1),
the inverting input (E−) is also connected to a second potential via a second oscillator capacitor (OC2) and via a control resistor ($R_{var}$, RST, ST1, ST2, ST3, ST4) that is series-connected to said second oscillator capacitor, and whose value can be adjusted or electrically controlled,
and the frequency (f) of the oscillator (112, 212) is varied by changing the value of the control resistor ($R_{var}$, RST, ST1, ST2, ST3, ST4),
wherein
a collector-emitter channel or a drain-source channel of a control transistor (ST1, ST2), is used as the control resistor
($R_{var}$, RST), so that the second oscillator capacitor (OC2) is connected to the second potential, especially to ground, via the collector-emitter channel or via the drain-source channel of the control transistor (ST1, ST2),
a control voltage (Uc) is applied at the base or gate of the control transistor (ST1, ST2),
and the frequency of the oscillator (112, 212) is varied by changing the control voltage (Uc), wherein
the control voltage (Uc) and thus the frequency (f) of the oscillator (112, 212) are influenced, controlled or regulated via a modulated 1-bit signal, especially via a pulse width modulation,
wherein the control resistor (ST1, ST2) employed is one whose base or gate is connected to the output (IA) of an integrator (211, 211', 211A, 211B, 211C) whose input (IE, IE+, IE−) is connected to a trigger output (AUS2, BA, BA') of a trigger circuit (210, 210', 310), whereby
the trigger circuit (210, 210', 310) employed is one that is capable of delivering a trigger signal (OUT1) to the input (IE, IE+, IE−) of the integrator (211, 211', 211A, 211B, 211C) via the trigger output (AUS2, BA, BA'), said trigger signal being either equal to or smaller than a first voltage value (U1) or equal to or greater than a second voltage value (U2), whereby the first voltage value (U1) is smaller than the second voltage value (U2), wherein
a pulse-modulated 1-bit signal that alternates essentially like a square wave between the first and second voltage values (U1, U2) is used as the trigger signal (OUT1), so that
either the control voltage (Uc) can be lowered in that a mean value of the trigger signal (OUT1) is decreased by correspondingly changing a time sequence of the first and second voltage values (U1, U2), and the control voltage (Uc) can be raised in that the mean value of the trigger signal (OUT1) is increased by correspondingly changing the time sequence of the first and second voltage values (U1, U2)
or vice versa,
and the frequency (f) of the oscillator (112, 212) or its rate of change is influenced or controlled via the pulse-modulated 1-bit signal.

31. The method according to claim 30, characterized in that a pulse-modulated 1-bit signal that oscillates essentially like a square wave with a variable pulse-duty factor between the first and second voltage values (U1, U2) can be used as the trigger signal (OUT1), whereby the mean value of said signal can be varied by correspondingly changing the pulse-duty factor, so that the frequency (f) of the oscillator (112, 212) or its rate of change is influenced or controlled by a pulse-width modulation.

32. The method according to claim 21, characterized in that the trigger circuit (210, 210', 310) employed is one that has an input (E1, E1') that is connected to the output (A) of the toggle circuit or of the Schmitt trigger (3), via which the frequency (f) of the oscillator (112, 212) is detected, and the frequency (f) of the oscillator (112, 212) is influenced by means of the trigger signal (OUT1) in such a way that it decreases if it is greater than a predefinable target frequency ($f_{targ}$), and it increases if it is smaller than the target frequency ($f_{targ}$),
so that the frequency (f) of the oscillator (112, 212) is regulated via the trigger circuit (210, 210', 310).

33. The method according to claim 21, characterized in that the time sequence of the first and second voltage values (U1, U2) is changed in such a way that
the frequency of the oscillator (112, 212) decreases if the frequency of the oscillator (112, 212) is greater than the predefinable target frequency ($f_{targ}$),
and the frequency of the oscillator (112, 212) increases if the frequency of the oscillator (112, 212) is smaller than the predefinable target frequency,
so that the oscillator (112, 212) is regulated via a pulse modulation.

34. The method according to claim 32, characterized in that the trigger circuit (310) employed is one that has a computer means (EDVE) comprising the following components:
a first binary connection (AA) that emits a first binary signal (OUTA) and that is connected to the trigger output (AUS2) via a first feed line (Z1) in which a first intermediate resistor (RZ1) is interconnected,
a second binary connection (AB) that emits a second binary signal (OUTB) that is connected to the trigger output (AUS2) via a second feed line (Z2) in which a first diode (D1) and an intermediate resistor (RZ2) series-connected downstream from said first diode are interconnected, whereby
the second intermediate resistor (RZ2) has a smaller value than the first intermediate resistor (RZ1),
and an anode of the first diode (D1) is connected to the second binary connection (AB) and a cathode of the first diode (D1) is connected to the second intermediate resistor (RZ2),
a third binary connection (AC) that emits a third binary signal (OUTC) and that is connected to a third feed line (Z3) that branches off from the second feed line (Z2) between the first diode (D1) and the second intermediate resistor and in which feed line a second diode (D2) is interconnected whose cathode is connected to the third binary connection (AC) and whose anode is connected to the cathode of the first diode (D1), whereby a) the first, second and third binary signals (OUTA, OUTB, OUTC) are each a high-signal or a low-signal or a time sequence of such signals, b) the first binary connection (AA) emits a high-signal if the frequency of the oscillator (112, 212) is smaller than the target frequency, and otherwise, it emits a low-signal, or vice versa, and c) the trigger circuit (310)

can be set into a first mode, fast mode, in which the second and the third binary connections (AB, AC) each emit a high-signal when the first binary connection (AA) emits a high-signal, and each emit a low-signal when the first binary connection (AA) emits a low-signal, so that the integrator (211, 211', 211A, 211B, 211C) is capable of integrating the trigger signal (OUT1) having a first time constant, into the control voltage (Uc), and can be set into a second mode, slow mode, in which the second binary connection (AB) always emits a low-signal and the third binary connection (AC) always emits a high-signal, so that the integrator (211, 211', 211A, 211B, 211C) is capable of integrating the trigger signal (OUT1) having a second time constant that is greater than the first time constant, into the control voltage (Uc).

35. The method according to claim 34, characterized in that, after the trigger circuit (310) has been switched on or reset, it is first automatically set into the fast mode and after a certain period of time or if the frequency of the oscillator (112, 212) has fallen below a predefined distance from the target frequency, or if the frequency of the oscillator (112, 212) has reached a predefined frequency range, said trigger circuit is set into the slow mode.

* * * * *